US012603575B2

(12) United States Patent
Hirata et al.

(10) Patent No.: US 12,603,575 B2
(45) Date of Patent: Apr. 14, 2026

(54) POWER CONVERSION DEVICE USING PCB'S

(71) Applicant: Mitsubishi Electric Corporation, Tokyo (JP)

(72) Inventors: Mikito Hirata, Tokyo (JP); Kenta Fujii, Tokyo (JP); Hiroyuki Kiyonaga, Tokyo (JP); Yusuke Morimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 268 days.

(21) Appl. No.: 18/554,924

(22) PCT Filed: May 2, 2022

(86) PCT No.: PCT/JP2022/019517
§ 371 (c)(1),
(2) Date: Oct. 11, 2023

(87) PCT Pub. No.: WO2022/239698
PCT Pub. Date: Nov. 17, 2022

(65) Prior Publication Data
US 2024/0195307 A1     Jun. 13, 2024

(30) Foreign Application Priority Data

May 11, 2021     (JP) ................................. 2021-080372

(51) Int. Cl.
H02M 3/335 (2006.01)
H05K 1/14 (2006.01)
(Continued)

(52) U.S. Cl.
CPC .............. H02M 3/335 (2013.01); H05K 1/14 (2013.01); H05K 5/0247 (2013.01); H05K 7/1007 (2013.01); H05K 9/0024 (2013.01)

(58) Field of Classification Search
None
See application file for complete search history.

(56) References Cited

U.S. PATENT DOCUMENTS 9,576,913 B2 * 2/2017 Soyano .................. H05K 13/00
10,687,413 B2 * 6/2020 Chen .................. H05K 7/20909
(Continued)

FOREIGN PATENT DOCUMENTS

JP     S62152491 U     9/1987
JP     H0638300 U     5/1994
(Continued)

OTHER PUBLICATIONS

Original and Translation of WO2020241423 (Year: 2020).*
(Continued)

*Primary Examiner* — Timothy J. Dole
*Assistant Examiner* — Muhammed Azam
(74) *Attorney, Agent, or Firm* — .Buchanan Ingersoll & Rooney PC

(57) ABSTRACT

A power conversion device includes a casing, a first printed board, a second printed board, and a control circuit board. The casing has at least two inner surfaces. The first printed board is fixed to the inner surface of the casing. The second printed board is fixed to the inner surface of the casing, and disposed so as to intersect with the first printed board. The control circuit board is disposed along the second printed board. The control circuit board includes a circuit wiring and a shield pattern opposite to the circuit wiring in a layer different from the circuit wiring. When viewed from an opposite direction in which the shield pattern is opposite to the circuit wiring, the shield pattern at least partially overlaps the circuit wiring.

14 Claims, 44 Drawing Sheets

(51) Int. Cl.

| | |
|---|---|
| *H05K 5/02* | (2006.01) |
| *H05K 7/10* | (2006.01) |
| *H05K 9/00* | (2006.01) |

(56) References Cited

U.S. PATENT DOCUMENTS

| | | | | |
|---|---|---|---|---|
| 10,813,255 | B2 * | 10/2020 | Hayashi | ............. H05K 7/14322 |
| 12,133,369 | B2 * | 10/2024 | Yoshimi | ................. H05K 7/209 |
| 12,183,498 | B2 * | 12/2024 | Kiyonaga | ................ H01F 27/22 |
| 2015/0001702 | A1 * | 1/2015 | Kawauchi | .......... H05K 7/14322 |
| | | | | 257/731 |
| 2019/0058415 | A1 * | 2/2019 | Sun | .......................... H02M 7/48 |
| 2019/0206810 | A1 * | 7/2019 | Kanai | ...................... H05B 6/06 |
| 2020/0077532 | A1 | 3/2020 | Fujiki | |
| 2023/0387821 | A1 * | 11/2023 | Waltrich | ................. H01L 24/18 |
| 2024/0195307 | A1 * | 6/2024 | Hirata | .................. H05K 7/1007 |
| 2024/0250601 | A1 * | 7/2024 | Ludwig | ................. H02M 7/106 |

FOREIGN PATENT DOCUMENTS

| | | | |
|---|---|---|---|
| JP | 4231626 | B2 | 12/2008 |
| JP | 2020035936 | A | 3/2020 |

OTHER PUBLICATIONS

International Search Report (PCT/ISA/210) with translation and Written Opinion (PCT/ISA/237) mailed on Jul. 19, 2022, by the Japanese Patent Office as the International Searching Authority for International Application No. PCT/JP2022/019517. (8 pages).

* cited by examiner

POWER CONVERSION DEVICE USING PCB'S

TECHNICAL FIELD

The present disclosure relates to a power conversion device.

BACKGROUND ART

A power conversion device such as a DC (direct current)-DC conversion device includes electronic components such as a switching element, a rectifier element, and a magnetic component such as a transformer or a reactor as well as a control circuit board that controls the switching element.

The electronic components such as the switching element and the control circuit board are three-dimensionally disposed, whereby the power conversion device can be downsized. As an example of the power conversion device that can be downsized as described above, Japanese Patent No. 4231626 (PTL 1) describes an automobile motor drive device. In the automobile motor drive device, a power conversion element is disposed on a bottom surface of a casing. A control element is mounted on a printed board. The power conversion element and the printed board on which the control element is mounted are disposed so as to be piled up.

CITATION LIST

Patent Literature

PTL 1: Japanese Patent No. 4231626

SUMMARY OF INVENTION

Technical Problem

The electronic component such as the switching element behaves as a noise source that generates noise, so that the noise generated in the electronic component is superimposed on the control circuit board when the electronic component such as the switching element is brought close to the control circuit board. Thus, malfunction of the circuit of the control circuit board is easily generated. Accordingly, when the power conversion device is downsized, a noise resistance of the control circuit board is required to be enhanced.

In the automobile motor drive device described in the above patent literature, the power conversion element and the printed board on which the control element is mounted are disposed so as to be piled up. For this reason, wiring connecting the power conversion element and the control element can be shortened as compared with the case where the control element is installed outside the casing. In this way, it is considered that an influence of the noise is made difficult by shortening the wiring connecting the power conversion element and the control element.

However, the noise due to the electronic components disposed in multiple planes cannot be reduced in downsizing the power conversion device only by shortening the wiring connecting the power conversion element and the control element as in the automobile motor drive device described in the above patent literature. Accordingly, it is difficult to increase the noise resistance of the control circuit board.

The present disclosure has been made in view of the above problems, and an object of the present disclosure is to provide a power conversion device having a control circuit board that can be downsized and has excellent noise resistance.

Solution to Problem

A power conversion device of the present disclosure includes a casing, a first printed board, a second printed board, and a control circuit board. The casing includes at least two inner surfaces. The first printed board is fixed to the inner surface of the casing. The second printed board is fixed to the inner surface of the casing and disposed so as to intersect with the first printed board. The control circuit board is disposed along the second printed board. The control circuit board includes circuit wiring and a shield pattern opposite to the circuit wiring in a layer different from the circuit wiring. When viewed from an opposite direction in which the shield pattern is opposite to the circuit wiring, the shield pattern at least partially overlaps the circuit wiring.

Advantageous Effects of Invention

According to the power conversion device of the present disclosure, the power conversion device having the control circuit board that can be downsized and has the excellent noise resistance can be provided.

BRIEF DESCRIPTION OF DRAWINGS

FIG. 3 is a top view illustrating the power conversion device of the first embodiment.

FIG. 13 is a graph illustrating a noise shielding effect by extension of a shield pattern.

FIG. 24 is a top view illustrating the power conversion device of the second embodiment.

FIG. 29 is a sectional view corresponding to FIG. 28 according to a modification of the second embodiment.

FIG. 31 is a top view illustrating the power conversion device of the third embodiment.

FIG. 34 is a top view illustrating the power conversion device of the fourth embodiment.

DESCRIPTION OF EMBODIMENTS

Figure 1:
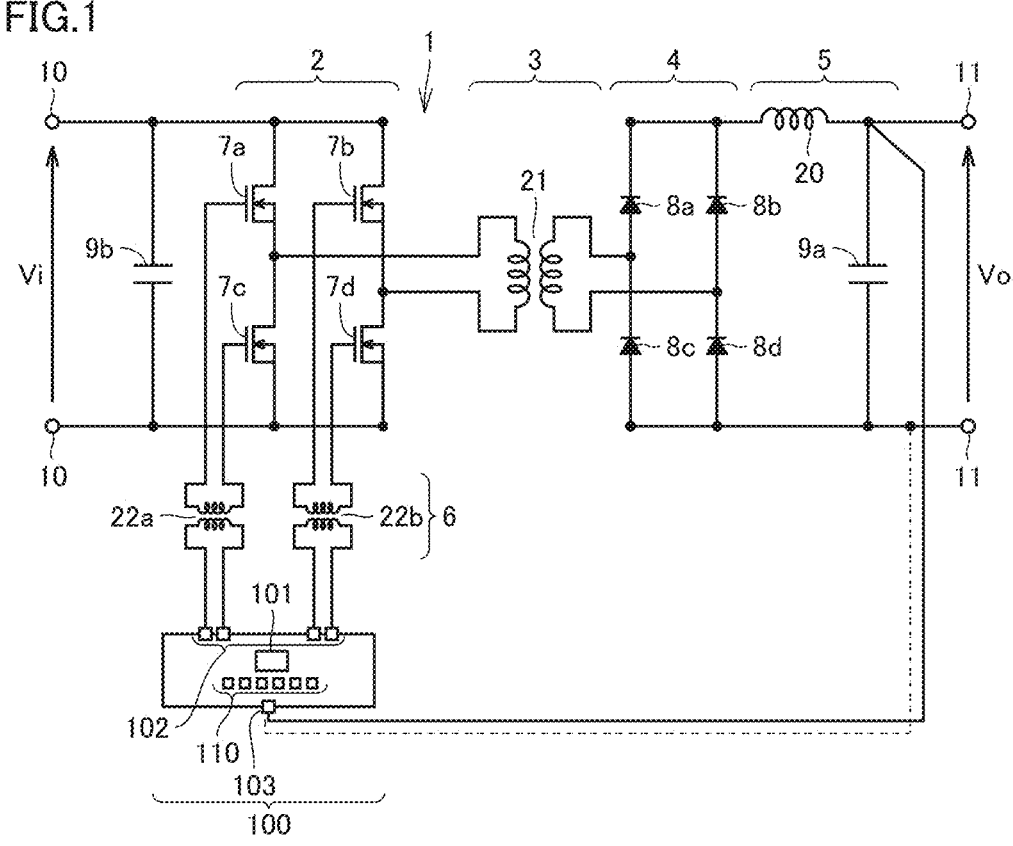
FIG. 1 is a circuit diagram illustrating an example of a power conversion device according to a first embodiment.

A power conversion device according to an embodiment will be described below. In the following description, the same or corresponding parts are denoted by the same reference numerals, and overlapping description will not be repeated. In addition, components are not illustrated as appropriate in order to make the drawings easily viewable.

First Embodiment

A power conversion device according to a first embodiment will be described below. FIG. 1 is a circuit diagram illustrating an example of the power conversion device of the first embodiment.

A power conversion device 1 in FIG. 1 is a DC-DC conversion device. Power conversion device 1 includes an inverter circuit 2, a transformer circuit 3, a rectifier circuit 4, a smoothing circuit 5, and a control circuit 100. Power conversion device 1 converts a DC voltage Vi input from an input terminal 10 into a DC voltage Vo, and outputs DC voltage Vo from an output terminal 11.

Inverter circuit 2 includes switching elements 7a, 7b, 7c, 7d. Each of switching elements 7a, 7b, 7c, 7d is a metal oxide semiconductor field effect transistor (MOSFET), an insulated gate bipolar transistor (IGBT), or the like. Each of switching elements 7a, 7b, 7c, 7d is made of silicon (Si), silicon carbide (SiC), gallium nitride (GaN), or the like.

Transformer circuit 3 includes a transformer 21. Transformer 21 includes a primary-side high voltage-side winding connected to inverter circuit 2, a core material such as ferrite, and a secondary-side low voltage-side winding.

Rectifier circuit 4 includes diodes 8a, 8b, 8c, 8d. Each of diodes 8a, 8b, 8c, 8d is made of Si, SiC, GaN, or the like.

Smoothing circuit 5 includes a smoothing coil 20 and a capacitor 9a.

Control circuit 100 includes a control element 101 that generates and outputs a control signal controlling inverter circuit 2, a connection member 102 such as a connector connecting to inverter circuit 2, a connection member 103 such as a feedback connector that detects DC voltage Vo, and an electronic component such as a capacitor or a resistor.

A pulse transformer circuit 6 includes pulse transformers 22a, 22b. Pulse transformer circuit 6 electrically insulates the control signal output from control circuit 100, and controls switching elements 7a, 7b, 7c, 7d of inverter circuit 2.

Input terminal 10 to which DC voltage Vi is input, output terminal 11 that outputs DC voltage Vo, switching elements 7a, 7b, 7c, 7d, diodes 8a, 8b, 8c, 8d, and capacitors 9a, 9b are mounted on a printed board. The printed board is attached to a support. The support is a casing of power conversion device 1. The casing is made of metal and also serves as a cooler. A ground (GND) of power conversion device 1 is connected to the support. Other electronic components may be mounted on the printed board.

For example, DC voltage Vi of 100 V to 600 V is input to power conversion device 1. For example, power conversion device 1 outputs DC voltage Vo of 12 V to 16 V. Specifically, DC voltage Vi input to input terminal 10 is converted into a first AC voltage by inverter circuit 2 and control circuit 100 that control inverter circuit 2. The first AC voltage is converted into a second AC voltage lower than the first AC voltage by transformer circuit 3. The second AC voltage is rectified by rectifier circuit 4. Smoothing circuit 5 smooths the voltage output from rectifier circuit 4. Power conversion device 1 outputs DC voltage Vo output from smoothing circuit 5 from output terminal 11. In order to obtain prescribed DC voltage Vo, DC voltage Vo is fed back to control circuit 100, and control circuit 100 generates the control signal according to DC voltage Vo, controls inverter circuit 2, and keeps DC voltage Vo at a prescribed value.

In power conversion device 1 configured as described above and illustrated in the circuit diagram of FIG. 1, the electronic components having a large temporal change in voltage (dV/dt) and a large temporal change in current (di/dt), such as inverter circuit 2 that converts DC voltage Vi into the AC voltage, are a noise generation source. The noise is radiated from circuit wiring or the like on the printed board connected to these electronic components. The emitted noise is induced into the proximate circuit. When the noise is induced in control circuit 100, a control signal different from the original signal is output. Thus, timing at which inverter circuit 2 controls switching elements 7a, 7b, 7c, 7d changes. As a result, sometimes the DC voltage Vo fluctuates. In the worst case, switching elements 7a, 7c, 7b, 7d are simultaneously turned on, so that overcurrent flows through switching elements 7a, 7b, 7c, 7d, which sometimes damages switching elements 7a, 7b, 7c, 7d.

Figure 2:
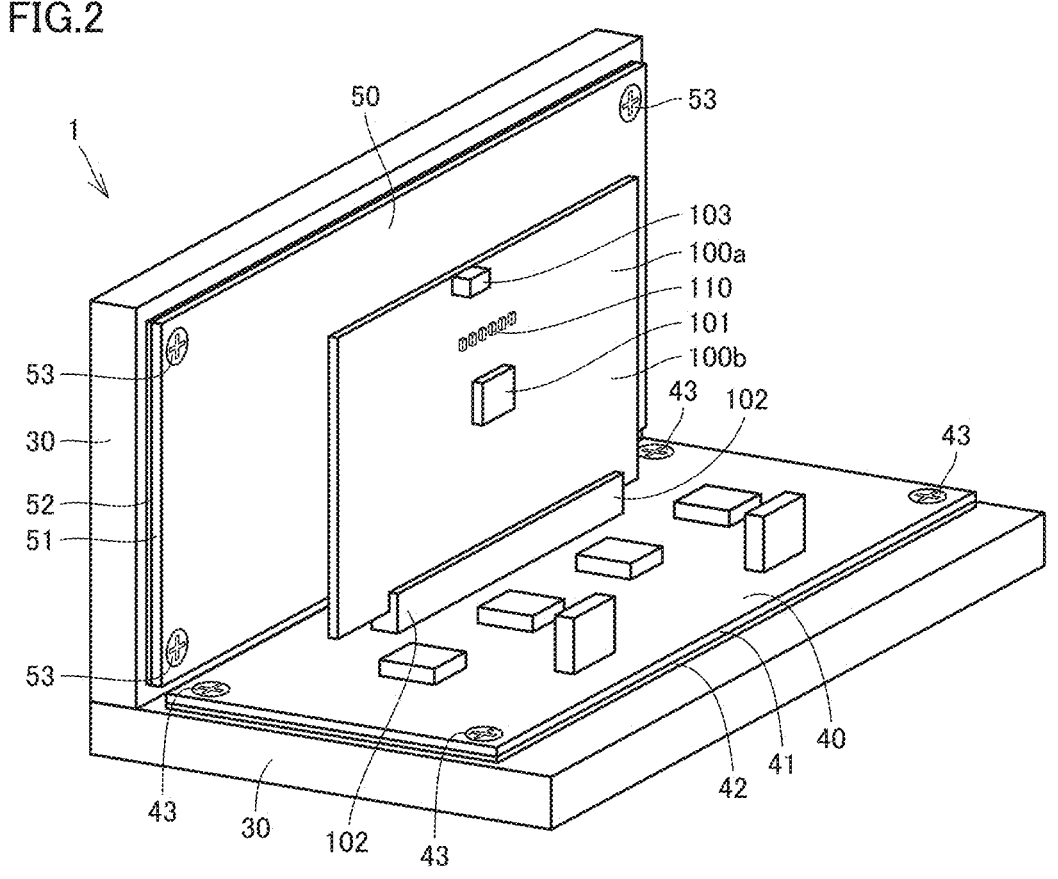
FIG. 2 is a perspective view illustrating the power conversion device of the first embodiment.
Figure 3:
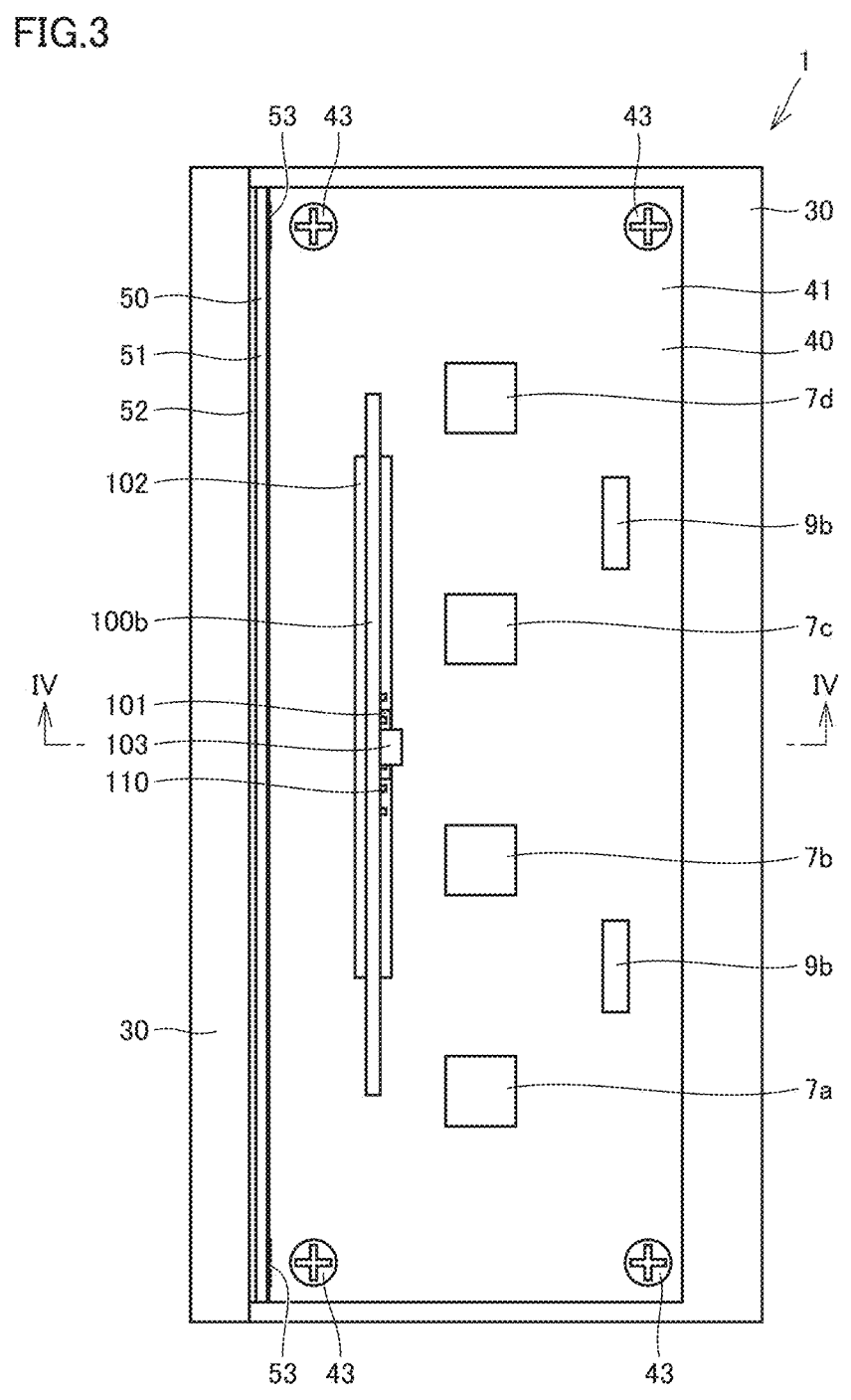
Figure 4:
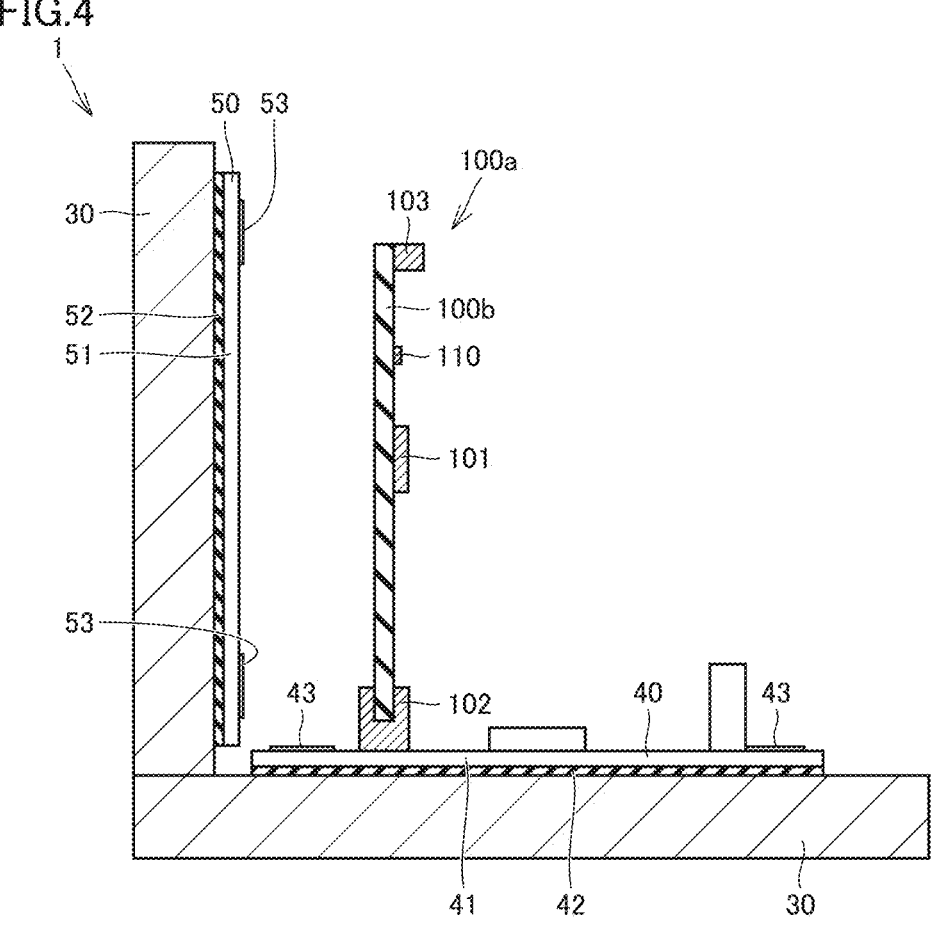
FIG. 4 is a sectional view taken along a line IV-IV in FIG. 3.
Figure 5:
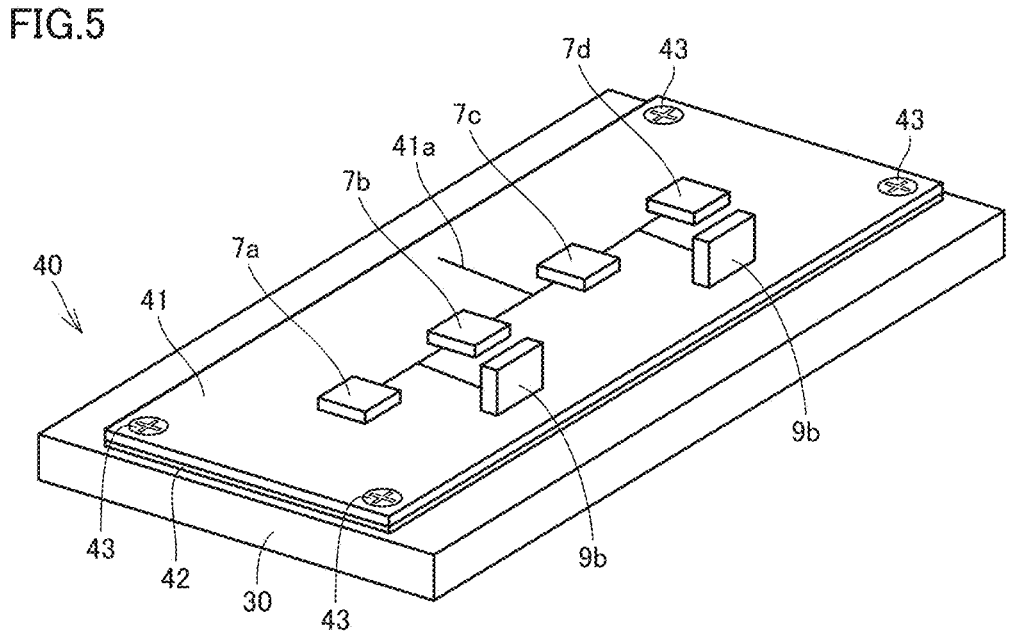
FIG. 5 is a perspective view illustrating a first printed board module of the first embodiment.
Figure 6:
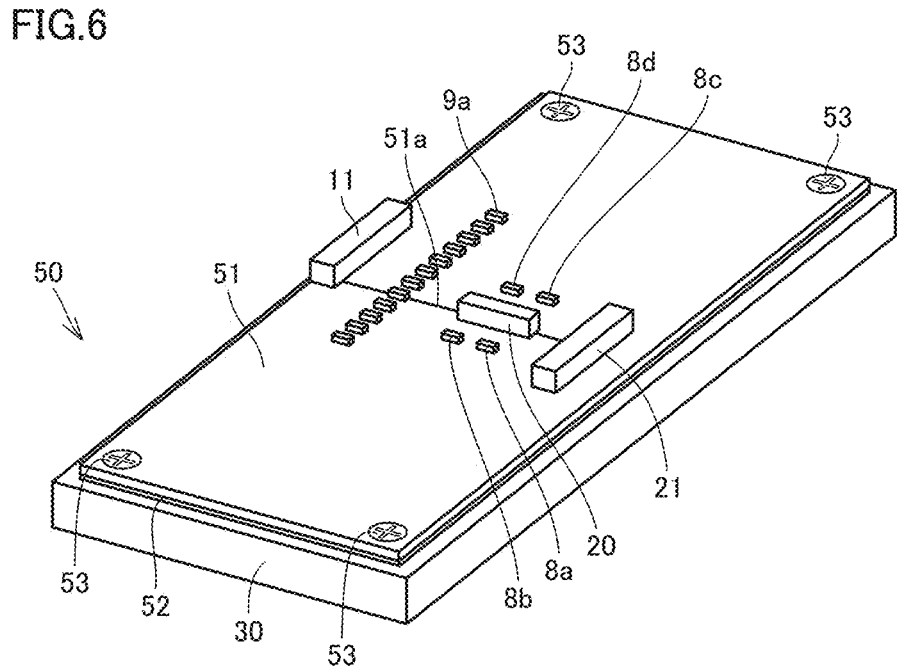
FIG. 6 is a perspective view illustrating a second printed board module of the first embodiment.

FIG. 2 is a perspective view illustrating power conversion device 1 of the first embodiment. FIG. 3 is a top view illustrating power conversion device 1 in FIG. 2. FIG. 4 is a sectional view taken along a line IV-IV in FIG. 3. FIG. 5 is a perspective view illustrating a first printed board module 40 included in power conversion device 1. FIG. 6 is a perspective view illustrating a second printed board module 50 included in power conversion device 1.

As illustrated in FIG. 2, power conversion device 1 of the first embodiment includes a casing 30, first printed board module 40, second printed board module 50, and a control circuit module 100a. First printed board module 40 and second printed board module 50 are electrically connected by a harness (not illustrated) or the like. In FIG. 2, power conversion device 1 includes two printed board modules, but may include three printed board modules.

As illustrated in FIGS. 2 to 4, power conversion device 1 includes casing 30, a first printed board 41, a first insulating member 42, a first fixing member 43, a second printed board 51, a second insulating member 52, a second fixing member 53, a control circuit board 100b as a board of control circuit module 100a, connection member 102, and connection member 103. In FIGS. 2 to 4, an external coolant (not illustrated) is connected to a bottom surface side of casing 30, for example, a bottom surface of a portion to which first printed board 41 is fixed. Thus, heat dissipation is excellent. Switching elements 7a, 7b, 7c, 7d are mounted on first printed board 41 as electronic components that generate a large amount of heat.

Casing 30 has at least two inner surfaces. In the first embodiment, casing 30 has two inner surfaces. Casing 30 is configured such that the inner surfaces of the two surfaces intersect with each other.

First printed board 41 is fixed to the inner surface of casing 30. First printed board 41 has a front surface on which the electronic component is mounted and a back surface opposite to casing 30. First insulating member 42 is disposed between first printed board 41 and casing 30. First printed board 41 is thermally connected to casing 30. First fixing member 43 is configured to fix first printed board 41 to casing 30. First printed board 41 is connected to casing 30 by first fixing member 43.

Second printed board 51 is fixed to the inner surface of casing 30. Second printed board 51 is disposed so as to intersect with first printed board 41. In the first embodiment, second printed board 51 is disposed perpendicular to first printed board 41. Second printed board 51 has the front surface on which the electronic component is mounted and the back surface opposite to casing 30. Second printed board 51 is electrically connected to first printed board 41 by a connection member (not illustrated). Second insulating member 52 is disposed between second printed board 51 and casing 30. Second printed board 51 is thermally connected to casing 30. Second fixing member 53 is configured to fix second printed board 51 to casing 30. Second printed board 51 is connected to casing 30 by second fixing member 53.

Control circuit board 100b is disposed along second printed board 51. In the first embodiment, control circuit board 100b is disposed perpendicular to first printed board 41 on which switching elements 7a, 7b, 7c, 7d are mounted, and disposed in parallel to second printed board 51. Control circuit board 100b is fixed to and electrically connected to first printed board 41 by connection member 102 such as a connector.

Casing 30 has thermal conductivity greater than or equal to 1.0 W/(m·K), preferably greater than or equal to 10.0 W/(m·K), and more preferably greater than or equal to 100.0 W/(m·K). Casing 30 is formed of a metal material such as copper, iron, aluminum, an iron alloy, or an aluminum alloy. Casing 30 may include piping through which cooling water is passed. Casing 30 may include a dissipation fin in order to promote heat dissipation to a surrounding atmosphere. Casing 30 may be in contact with the external coolant (not illustrated). In addition, casing 30 is not necessarily integrally molded, but may be formed by combining a plurality of metal plates and connecting the metal plates.

First printed board 41 and second printed board 51 may have circuit wiring (not illustrated) formed on the surface or inside. Control circuit board 100b may include at least two conductor layers, and the circuit wiring (not illustrated) may be formed on the surface or inside of the conductor layers. The circuit wiring has a thickness greater than or equal to 1 μm and less than or equal to 2000 μm. For example, the circuit wiring is formed of copper, nickel, gold, aluminum, silver, tin, or an alloy thereof. In the following embodiments, a material constituting the printed board, such as first printed board 41, second printed board 51, and control circuit board 100b, may be made of a glass fiber-reinforced epoxy resin, a phenol resin, polyphenylene sulfide (PPS), or polyether ether ketone (PEEK). In other words, first printed board 41, second printed board 51, and control circuit board 100b may be made of a material generally having low thermal conductivity. That is, each of first printed board 41, second printed board 51, and control circuit board 100b may be a general-purpose printed board. First printed board 41, second printed board 51, and control circuit board 100b may be made of ceramics such as aluminum oxide, aluminum nitride, and silicon carbide.

First insulating member 42 and second insulating member 52 have electric insulation. First insulating member 42 and second insulating member 52 may have elasticity. First insulating member 42 and second insulating member 52 may have a Young's modulus greater than or equal to 1 MPa and less than or equal to 100 MPa. First insulating member 42 and second insulating member 52 have thermal conductivity greater than or equal to 0.1 W/(m·K), preferably greater than or equal to 1.0 W/(m·K). For example, first insulating member 42 and second insulating member 52 may be made of a rubber material such as silicone or urethane, a resin material such as acrylonitrile butadiene styrene (ABS), polybutylene terephthalate (PBT), polyphenylene sulfide (PPS), or phenol, a polymer material such as polyimide, a ceramic material such as alumina (aluminum oxide) or aluminum nitride, or a phase change material mainly made of silicon. First insulating member 42 and second insulating member 52 may be made of a material in which particles such as aluminum oxide, aluminum nitride, and boron nitride are mixed in a silicone resin.

First fixing member 43 and second fixing member 53 may be made of metal or non-metal. For example, when the circuit wiring formed on first printed board 41 and second printed board 51 has the same potential as the circuit wiring of the connection destination of the fixing member or casing 30, the circuit wiring is electrically connected using a metal fixing member. On the other hand, a nonmetallic fixing member such as a resin screw may be used as long as the circuit wiring should not have the same potential. In other words, first fixing member 43 and second fixing member 53 may be used in accordance with product specifications.

With reference to FIGS. 5 and 6, an example of first printed board module 40 and second printed board module 50 will be described below.

As illustrated in FIG. 5, first printed board module 40 includes first printed board 41, first insulating member 42, first fixing member 43, and the electronic component (first component). The electronic component (first component) is mounted on first printed board 41. The electronic component (first component) is, in particular, switching elements 7a, 7b, 7c, 7d that are high-heat generating components, capacitor 9b, input terminal 10 (not illustrated), pulse transformers 22a, 22b (not illustrated), and the like. First insulating member 42 is provided between first printed board 41 and casing 30. First insulating member 42 is preferably in surface contact with first printed board 41 and casing 30. First fixing member 43 fixes first printed board 41 to casing 30.

As illustrated in FIG. 6, second printed board module 50 includes second printed board 51, second insulating member 52, second fixing member 53, and the electronic component (second component). The electronic component (second component) is mounted on second printed board 51. The electronic component (second component) is a transformer 21, diodes 8a, 8b, 8c, 8d, a smoothing coil 20, capacitor 9a, and output terminal 11. Electronic components constituting the power conversion device may be mounted on second printed board 51 except for switching elements 7a, 7b, 7c, 7d and control circuit 100. Second insulating member 52 is provided between second printed board 51 and casing 30. Second insulating member 52 is preferably in surface contact with second printed board 51 and casing 30. Second fixing member 53 fixes second printed board 51 to casing 30.

FIGS. 2 to 6 illustrate the case where the number of printed board modules is two, namely, first printed board module 40 and second printed board module 50. When at least three printed board modules on which electronic component is mounted exist, other electronic components may be arbitrarily mounted on second printed board module 50 and the Nth printed board module (N is greater than or equal to 3) except for switching elements 7a, 7b, 7c, 7d mounted on first printed board module 40.

Figure 7:
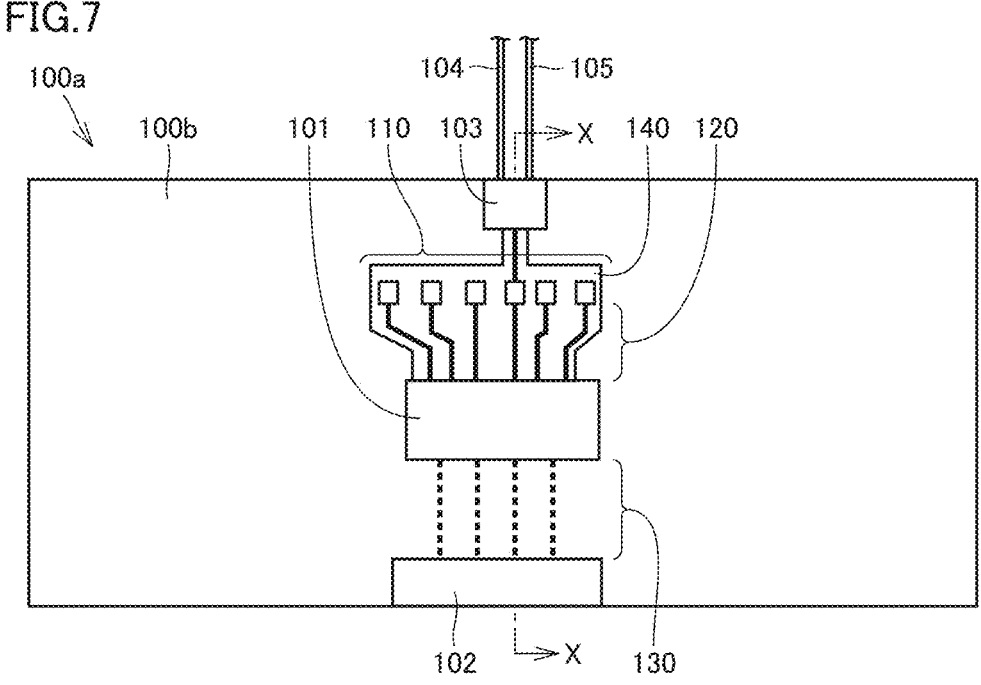
FIG. 7 is a perspective view illustrating a control circuit module of the first embodiment.
Figure 8:
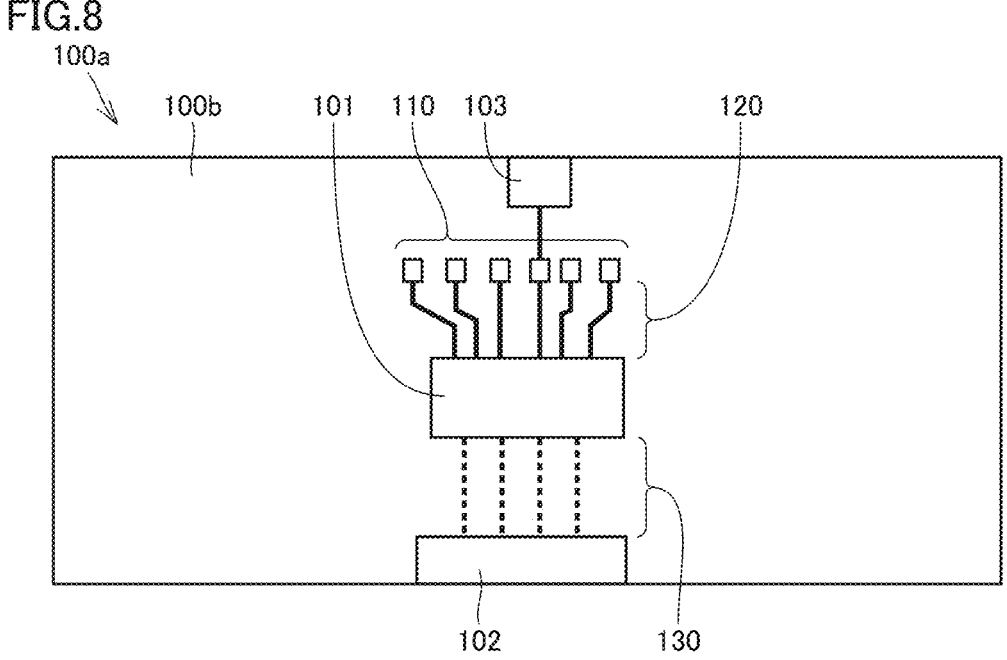
FIG. 8 is a top view illustrating a surface of the control circuit module of the first embodiment.
Figure 9:
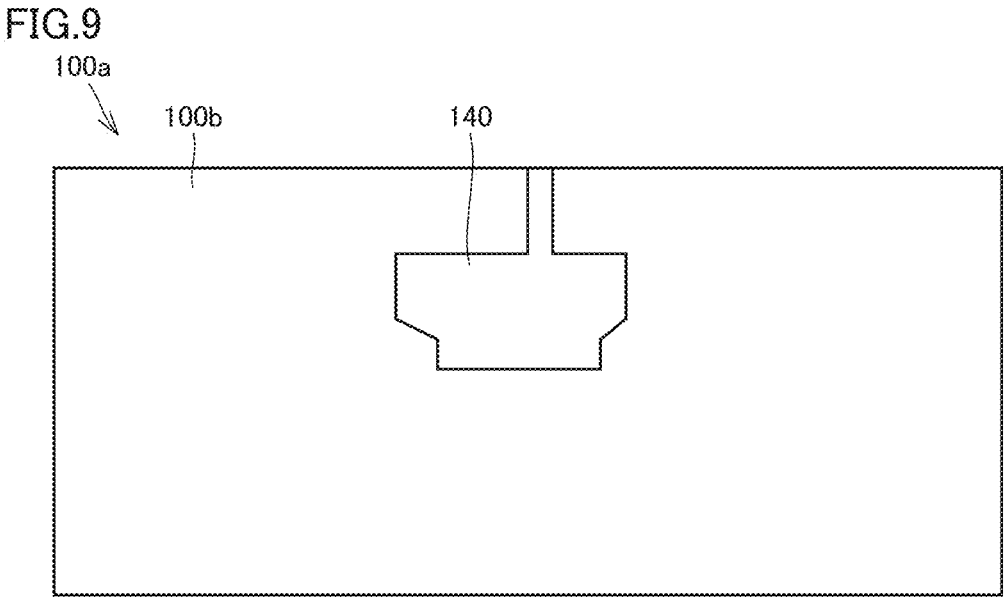
FIG. 9 is a top view illustrating a back surface of the control circuit module of the first embodiment.
Figure 10:
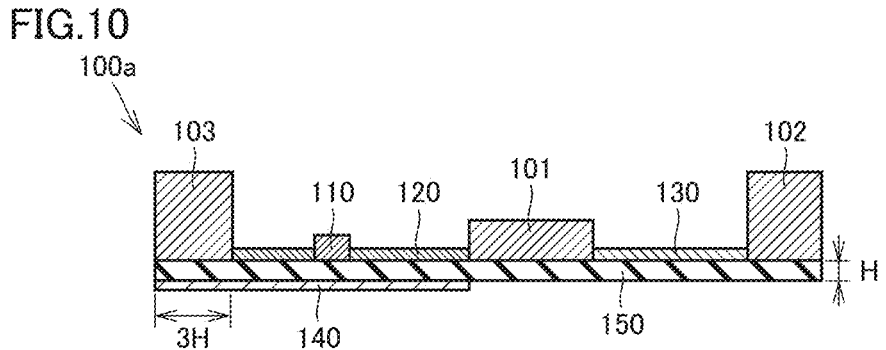
FIG. 10 is a sectional view taken along a line X-X in FIG. 7.
Figure 11:
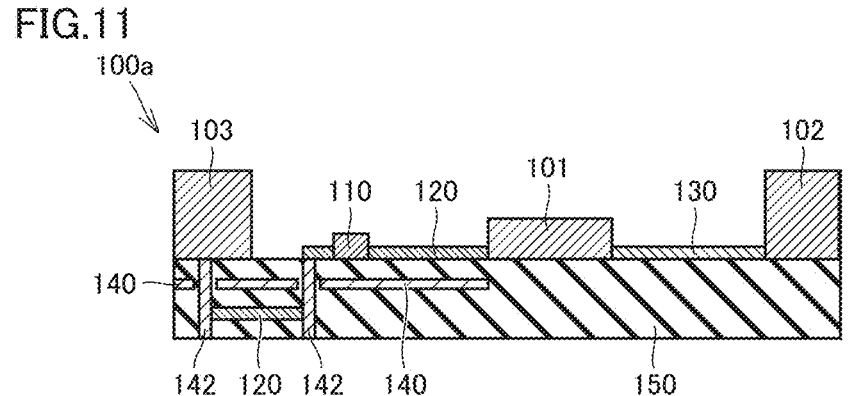
FIG. 11 is a sectional view taken along the line X-X in FIG. 7 when the control circuit board is a multilayer board.

With reference to FIGS. 7 to 11, an example of control circuit module 100a will be described below. FIG. 7 is a perspective view illustrating control circuit module 100a included in power conversion device 1. FIG. 8 is a top view illustrating a surface of control circuit module 100a in FIG. 7, and FIG. 9 is a top view illustrating a back surface of control circuit module 100a in FIG. 7. FIG. 10 is a sectional view taken along a line X-X in FIG. 7. FIG. 11 is a sectional view taken along a line X-X in FIG. 7 in the case where control circuit board 100b is not a double-sided board but a multilayer board. FIGS. 7 to 11 are schematic diagrams of control circuit module 100a.

As illustrated in FIG. 7, control circuit module 100a includes control circuit board 100b, control element 101, connection member 102, connection member 103, feedback wiring 104, reference GND wiring 105, and a control element electronic component 110. Control circuit board 100b includes an analog signal wiring group (circuit wiring) 120, a digital signal wiring group 130, and a shield pattern 140.

Control element 101 is a semiconductor element that outputs the control signal controlling switching elements 7a, 7b, 7c, 7d. The control signal output from control element 101 depends on a control method of power conversion device 1, and examples of the design parameters include a switching frequency, a duty ratio, and a dead time. Control element 101 changes a waveform of the control signal according to the potential difference of feedback wiring 104 with respect to reference GND wiring 105 or shield pattern 140 having the same potential as reference GND wiring 105 and the component of control element electronic component 110 or a constant of control element electronic component 110.

Connection member 102 fixes control circuit module 100a and first printed board module 40. Connection member 102 transmits the control signal between control circuit board 100b and first printed board 41. For example, connection member 102 is an inter-board connector, a mounting socket, a finger, or a clip. In addition, connection member 102 may be a connection member obtained by combining a connection member mounted on control circuit board 100b such as the inter-board connector and the printed board having the circuit wiring separately from control circuit board 100b. Although connection member 102 in FIG. 7 is one structure, connection member 102 may be attached in a plurality of parts. The mounting positions may be disposed on at least one side connected to first printed board 41 on control circuit board 100b.

Connection member 103 is used to connect feedback wiring 104 monitoring DC voltage Vo in the vicinity of output terminal 11 of power conversion device 1 and reference GND wiring 105 connected to the GND of output terminal 11 to control circuit board 100b. For example, connection member 103 may be a structural component such as a terminal block, an inter-board connector, a mounting socket, a finger, or a clip. When feedback wiring 104 or reference GND wiring 105 is an electric wire, they may be connected by soldering. Although connection member 103 in FIG. 7 is integrated, connection member 103 may be attached in a plurality of parts. The position of connection member 103 is not uniquely limited.

Feedback wiring 104 connects the vicinity of output terminal 11 of power conversion device 1 and connection member 103. For example, feedback wiring 104 may be a cable or an inter-board connector.

Reference GND wiring 105 connects the vicinity of output terminal 11 of power conversion device 1 and connection member 103. For example, reference GND wiring 105 may be a cable or an inter-board connector. Reference GND wiring 105 is referred to as GND, but the potential of reference GND wiring 105 is not limited to the ground or the frame GND. Reference GND wiring 105 provides a reference potential defining the potential of feedback wiring 104. For example, when the other end of the output terminal is at the same potential as casing 30 like a DC-DC conversion device in an in-vehicle device, the potential of reference GND wiring 105 is at the GND potential, in other words, at the same potential as casing 30.

Control element electronic component 110 is an electronic component connected to control element 101. For example, control element electronic component 110 is a chip resistor, or a ceramic capacitor. A type of mounted component, component disposition, the number of components, and the like may be adjusted to the circuit specifications of the output destination, such as control element 101, the driver element (not illustrated) that is the output destination of the control signal, pulse transformer circuit 6, and switching elements 7a, 7b, 7c, 7d, and electronic component (not illustrated) may be mounted.

Analog signal wiring group 120 is a circuit wiring between control element 101 and control element electronic component 110 setting a switching frequency, a duty ratio, a dead time, and the like of the control signal controlling switching elements 7a, 7b, 7c, 7d mounted on first printed board 41. The circuit wiring between control element 101 and connection member 103 also corresponds to analog signal wiring group 120. In control circuit board 100b, the wiring layer of analog signal wiring group 120 may be a surface layer or an inner layer of the printed board. However, analog signal wiring group 120 has a configuration opposite to shield pattern 140 described later in a different layer. In addition, the wiring region of analog signal wiring group 120 is wired inward by at least 1 time (1H) with respect to a thickness H of an insulating layer 150 provided between analog signal wiring group 120 and opposing shield pattern 140. The wiring region of analog signal wiring group 120 is desirably wired inside by at least 3 times (3H) thickness H of insulating layer 150. Analog signal wiring group 120 unintentionally functions as an antenna that receives a magnetic field by parasitic inductance and mutual inductance with a noise radiation source, or an antenna that receives an electric field by the parasitic capacitance with the noise radiation source. As a result, the noise is superimposed on the circuit wiring. Thus, because there is the case where the control signal different from the original design specification is output, analog signal wiring group 120 needs to have a wiring specification in which the noise is hardly superimposed.

Digital signal wiring group 130 is wiring that transmits the control signal. Digital signal wiring group 130 is wiring between control element 101 and connection member 102. In control circuit board 100b, the wiring layer of digital signal wiring group 130 may be a surface layer or an inner layer, but is not limited. The electronic component (not illustrated) such as a driver integrated circuit (IC) may be mounted between control element 101 and connection member 102.

Shield pattern 140 is circuit wiring having the same potential as reference GND wiring 105. The potential of shield pattern 140 is the same as the ground of control circuit board 100b. The ground potential of control circuit board 100b is the same potential as that of casing 30.

Shield pattern 140 may be provided at least on control circuit board 100b, but is not necessarily provided on each of the printed boards constituting first printed board module 40 and second printed board module 50, a third printed board module 60, a fourth printed board module 70, and a fifth printed board module 80 described later.

Shield pattern 140 is opposite to analog signal wiring group 120 in a layer different from analog signal wiring group 120. When viewed from an opposite direction in which shield pattern 140 is opposite to analog signal wiring group 120, shield pattern 140 at least partially overlaps analog signal wiring group 120.

However, because shield pattern 140 is a minimum region opposite to analog signal wiring group 120 in a different layer, the circuit wiring having the same potential as shield pattern 140 may be exist immediately below a signal wiring group different from analog signal wiring group 120. In addition, the circuit wiring having the potential same as shield pattern 140 may be exist in the same layer as analog signal wiring group 120.

In addition, shield pattern 140 is extended from analog signal wiring group 120 when viewed from the opposite direction in which shield pattern 140 is opposite to analog signal wiring group 120. That is, a projection region of shield pattern 140 covers the wiring region of analog signal wiring group 120 and protrudes outward from the outer end of the wiring region of analog signal wiring group 120. In the first embodiment, shield pattern 140 includes the circuit wiring extended by at least 1 time (1H) from the wiring region end of analog signal wiring group 120 with respect to thickness H of insulating layer 150 between the wiring layer of analog signal wiring group 120 and shield pattern 140 in a layer different from analog signal wiring group 120. In other words, analog signal wiring group 120 has a configuration in which at least 1H is wired inside the wiring region of opposing shield pattern 140.

In addition, when viewed from the opposite direction in which shield pattern 140 is opposite to analog signal wiring group 120, shield pattern 140 is extended by at least 3 times thickness H between analog signal wiring group 120 and shield pattern 140 in the opposite direction with respect to the outer end of analog signal wiring group 120. That is, the projection region of shield pattern 140 covers the wiring region of analog signal wiring group 120 and protrudes outward by at least 3 times thickness H with respect to the outer end of the wiring region of analog signal wiring group 120. For example, it is assumed that the thickness of the double-sided substrate is 1.6 mm, and analog signal wiring group 120 is wired on the component surface. Shield pattern 140 includes the circuit wiring extended by 3H, namely, 4.8 mm (3×1.6 mm) from the end of analog signal wiring group 120 on the solder surface. As the number of layers increases in the multilayer substrate and as the wiring layers of analog signal wiring group 120 and shield pattern 140 are adjacent to each other, thickness H of insulating layer 150 becomes relatively thin, so that the region where shield pattern 140 is extended can be made smaller than the wiring region of analog signal wiring group 120.

As described above, by extending shield pattern 140 from the wiring region of analog signal wiring group 120, not only the noise incident perpendicularly to shield pattern 140 but also the noise incident from an oblique direction can be shielded. As a result, the superimposition of the noise on analog signal wiring group 120 can be prevented.

When the component of the noise is the electric field, the electric field on the surface of shield pattern 140 is only the component in the normal direction. Therefore, even when shield pattern 140 is not extended from analog signal wiring group 120, the electric field can be reflected by the difference between the wave impedance of the noise radiation source and intrinsic impedance of shield pattern 140, so that the high shielding effect can be obtained.

However, when the component of the noise is the magnetic field, the magnetic field is formed so as to draw not only the normal direction component but also an arc with respect to the current path serving as the noise radiation source with respect to shield pattern 140. The magnetic field has a component with an incident angle corresponding to a distance from the noise radiation source, and the normal direction component is relatively small. In addition, in the magnetic field where the frequency of the noise is low and in the vicinity of the noise radiation source, it is difficult to obtain the shielding effect by reflection using the impedance difference between the media described above. Furthermore, because a skin depth of the nonmagnetic metal at low frequencies is deep, it is difficult to attenuate the magnetic field by generating an eddy current. In such a case, it is effective to prevent an induced voltage due to electromagnetic induction by reducing the magnetic field interlinking a loop formed between analog signal wiring group 120 and shield pattern 140 according to Faraday's law of electromagnetic induction.

As illustrated in FIG. 11, when control circuit board 100*b* is a multilayer substrate, analog signal wiring groups 120 on the surface layer and the inner layer of control circuit module 100*a* are electrically connected through vias 142.

Figure 12:
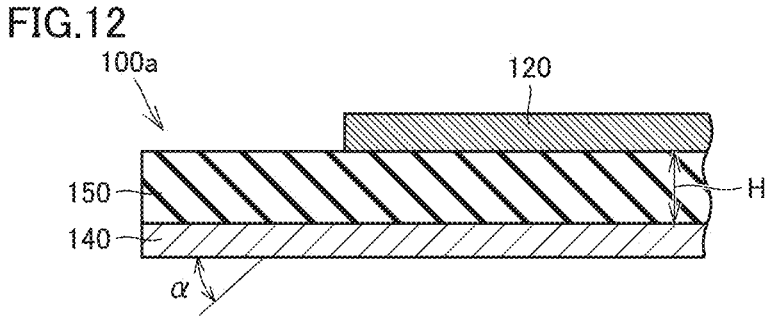
FIG. 12 is a sectional view illustrating the control circuit module indicating an incident angle of noise.

As illustrated in FIG. 12, when thickness H of insulating layer 150 is set and when shield pattern 140 is extended from the wiring region of analog signal wiring group 120, an incident angle α of the magnetic field capable of interlinking between analog signal wiring group 120 and shield pattern 140 is considered. It is possible to shield the magnetic field of incident angle α from 45 degrees (angle=arctan (1H/1H)) to 90 degrees in the case of the 1H extension, from 26.6 degrees (angle=arctan (1H/2H)) to 90 degrees in the case of the 2H extension, and from 18.4 degrees (angle=arctan (1H/3H)) to 90 degrees in the case of the 3H extension. That is, as shield pattern 140 is extended from the wiring area of analog signal wiring group 120, the magnetic field with wide incident angle α can be shielded. Furthermore, in the multilayer substrate, analog signal wiring group 120 is disposed in the inner layer of the printed board, and shield pattern 140 covers analog signal wiring group 120 with the upper and lower layers, so that the very high noise shielding effect can be obtained in all directions. As a result, by reducing the magnetic field that interlinks the loop formed by analog signal wiring group 120 and shield pattern 140, the superimposition of the noise on analog signal wiring group 120 can be prevented. Thus, the malfunction of control element 101 can be prevented.

Figure 13:
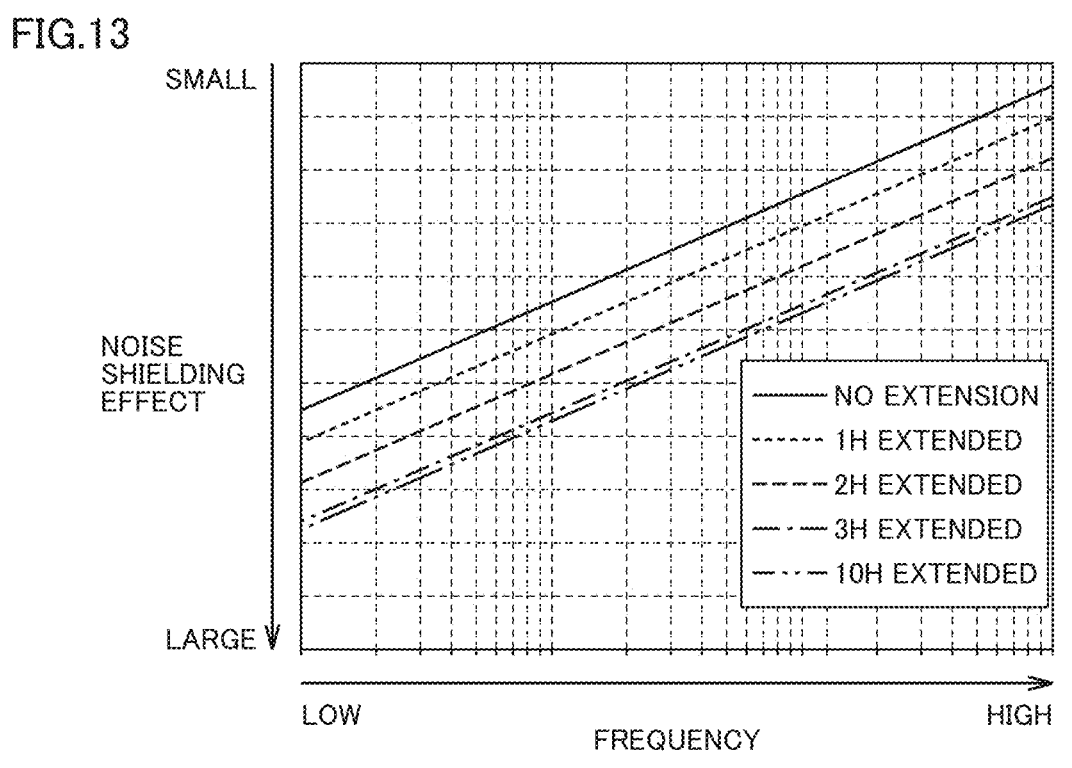

FIG. 13 illustrates an example of the effect of preventing the noise superimposing amount by extending shield pattern 140 from the wiring region of analog signal wiring group 120. The noise shielding effect increases as shield pattern 140 is extended from the wiring region end portion of analog signal wiring group 120 while shield pattern 140 is provided in a different layer opposite to analog signal wiring group 120. Furthermore, in the case of 3H extension, the result indicating the noise shielding effect equivalent to that in the case in which at least 3H is extended is obtained. Thus, even when shield pattern 140 is not provided on the one surface of the conductor layer of control circuit board 100*b*, the noise can be shielded by locally providing shield pattern 140 that is 3H-extended from the wiring region of analog signal wiring group 120.

Effects of power conversion device 1 of the first embodiment will be described below.

In power conversion device 1 of the first embodiment, second printed board 51 is disposed so as to intersect with first printed board 41, and control circuit board 100*b* is disposed along second printed board 51. Thus, power conversion device 1 can be downsized. In addition, shield pattern 140 at least partially overlaps analog signal wiring group 120 when viewed from the opposite direction in which shield pattern 140 is opposite to analog signal wiring group 120. Thus, the noise can be blocked by shield pattern

140. Accordingly, control circuit board 100*b* having the excellent noise resistance can be provided. As a result, power conversion device 1 that is excellent in the noise resistance and is less likely to the malfunction can be provided.

According to power conversion device 1 of the first embodiment, shield pattern 140 is extended from analog signal wiring group 120 when viewed from the opposite direction in which shield pattern 140 is opposite to analog signal wiring group 120. Thus, not only the noise incident perpendicularly to shield pattern 140 but also the noise incident from the oblique direction can be shielded. As a result, the superimposition of the noise on analog signal wiring group 120 can be prevented.

In addition, by providing the circuit wiring in which shield pattern 140 is opposite to analog signal wiring group 120 and is extended from the wiring region of analog signal wiring group 120, the parasitic inductance of analog signal wiring group 120 can be reduced. As a result, mutual inductance with the electronic components mounted on first printed board 41 or second printed board 51 and the wiring related to the electronic components can also be reduced. Thus, inductive coupling between analog signal wiring group 120 and switching elements 7*a*, 7*b*, 7*c*, 7*d* and the like can be prevented, so that the noise amount superimposed on analog signal wiring group 120 can be prevented.

According to power conversion device 1 of the first embodiment, when viewed from the opposite direction in which shield pattern 140 is opposite to analog signal wiring group 120, shield pattern 140 is extended by at least 3 times thickness H between analog signal wiring group 120 and shield pattern 140 in the opposite direction with respect to the outer end of analog signal wiring group 120. Thus, not only the noise incident perpendicularly to shield pattern 140 but also the noise incident from the oblique direction can be further shielded.

According to power conversion device 1 of the first embodiment, the potential of shield pattern 140 is the same as the ground of control circuit board 100*b*. Accordingly, shield pattern 140 has the function as the electrostatic shield that prevents electrostatic coupling.

According to power conversion device 1 of the first embodiment, the potential of the ground of control circuit board 100*b* is the same as the potential of casing 30. When shield pattern 140 is connected at the same potential as casing 30 through reference GND wiring 105, shield pattern 140 also has the function as the electrostatic shield that prevents the electrostatic coupling. Consequently, control circuit module 100*a* having the excellent noise resistance, and furthermore, power conversion device 1 having the excellent noise resistance and no malfunction can be provided.

With reference to FIGS. 14 to 22, three types of examples of control circuit module 100*a* will be described as modifications of the first embodiment. FIGS. 14 to 22 are different from the first embodiment in a shape of shield pattern 140 and the presence or absence of an extended shield pattern 141. The modifications of the first embodiment have the same configuration, operation, and effect as those of the first embodiment described above unless otherwise specified. Consequently, the same components as those in the first embodiment are denoted by the same reference numerals, and the description thereof will not be repeated.

Figure 14:
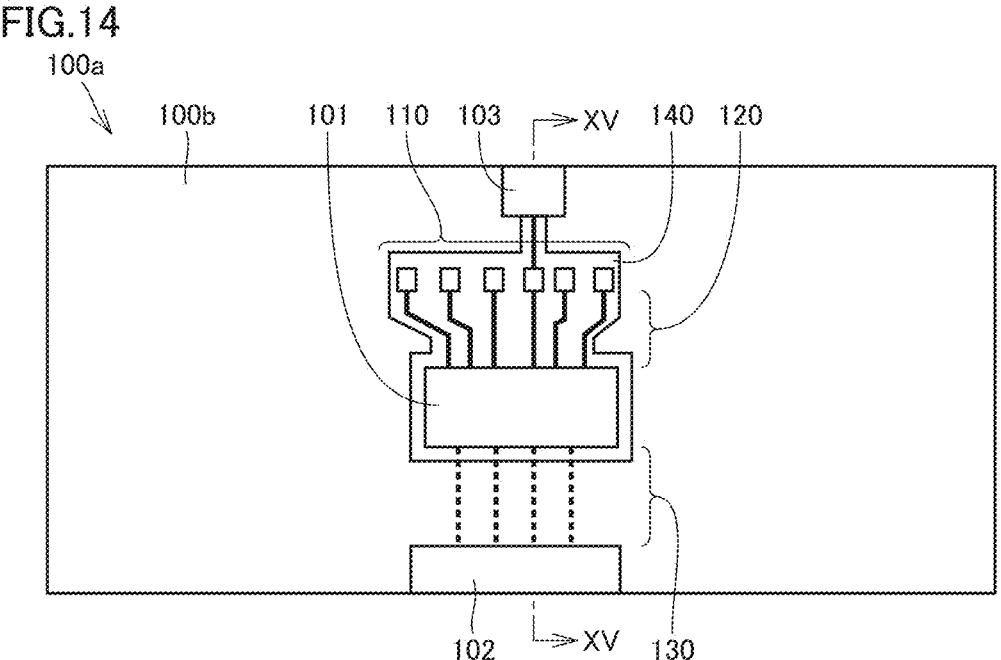
FIG. 14 is a perspective view illustrating a control circuit module according to a first modification of the first embodiment.
Figure 15:
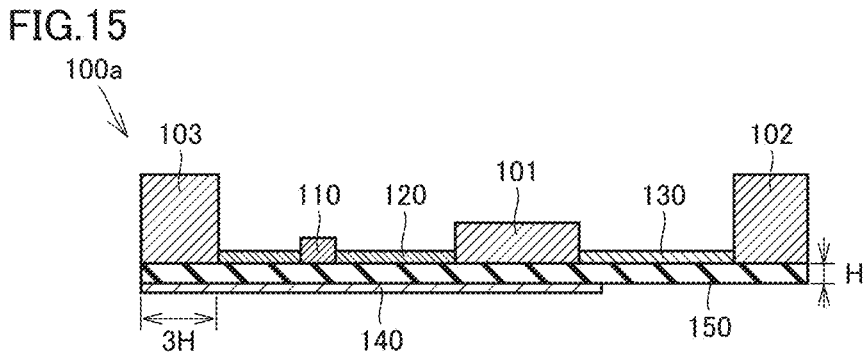
FIG. 15 is a sectional view taken along a line XV-XV in FIG. 14.

With reference to FIGS. 14 and 15, a first modification of the first embodiment will be described first. FIG. 14 is a perspective view illustrating control circuit module 100*a* according to the first modification of the first embodiment. FIG. 15 is a sectional view taken along a line XV-XV in FIG. 14. Focusing on the difference from the first embodiment, the description of the same configuration, operation, and effect will not be repeated.

In shield pattern 140 of the first modification of the first embodiment, not only analog signal wiring group 120 but also control element 101 are opposite to each other in different layers. Shield pattern 140 is extended from the end portions of the wiring region of analog signal wiring group 120 and the component arrangement region of control element 101 by at least 1 time (1H), preferably 3 times (3H) with respect to thickness H of insulating layer 150 provided between shield patterns 140 opposite to the wiring layer of analog signal wiring group 120. In other words, at least 3H of analog signal wiring group 120 and control element 101 is wired inside the wiring region of opposing shield pattern 140.

As described above, by extending shield pattern 140 from the wiring regions of analog signal wiring group 120 and control element 101, not only the noise incident perpendicularly to shield pattern 140 but also the noise incident from the oblique direction can be shielded. As a result, the superimposition of the noise on analog signal wiring group 120 and control element 101 can be prevented.

When control circuit board 100b is designed, the amount of noise superposition can be reduced by shortening the wiring length of analog signal wiring group 120. However, the noise resistance of control element 101 depends on a chip manufacturer, and the noise resistance is affected by the circuit wiring on the interposer inside the package of control element 101. The first modification of the first embodiment has an advantage that the noise resistance of control element 101 depending on the chip manufacturer can be enhanced by the design of control circuit board 100b.

Figure 16:
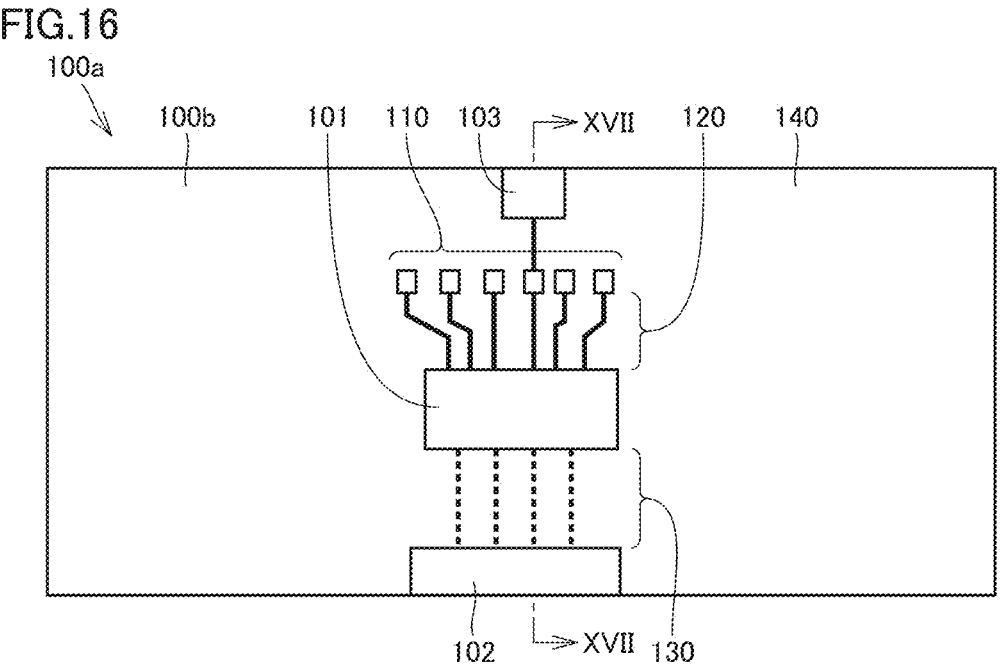
FIG. 16 is a perspective view illustrating a control circuit module according to a second modification of the first embodiment.
Figure 17:
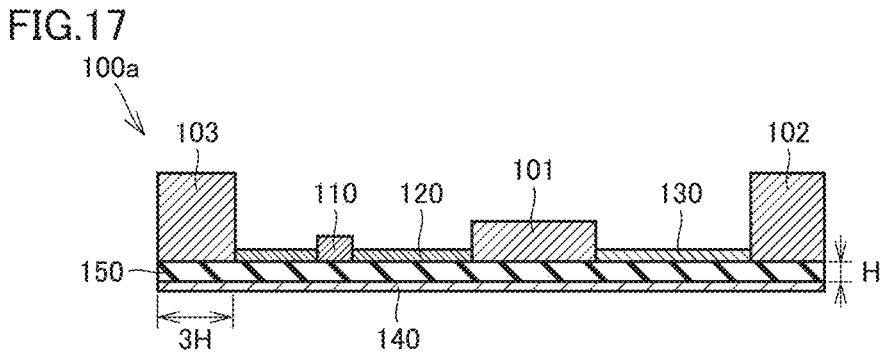
FIG. 17 is a sectional view taken along a line XVII-XVII in FIG. 16.

With reference to FIGS. 16 and 17, a second modification of the first embodiment will be described below. FIG. 16 is a perspective view illustrating control circuit module 100a according to the second modification of the first embodiment. FIG. 17 is a sectional view taken along a line XVII-XVII in FIG. 16. Focusing on the difference from the first embodiment, the description of the same configuration, operation, and effect will not be repeated.

Shield pattern 140 of the second modification of the first embodiment is provided on one surface of a layer different from analog signal wiring group 120, digital signal wiring group 130, control element 101, and the like. In other words, shield pattern 140 having the same size as the outer shape of control circuit board 100b, which covers all the signal wirings and the regions of the electronic components on control circuit board 100b, is provided except for connection member 102 and connection member 103.

As described above, by providing shield pattern 140 on one surface of control circuit board 100b, not only the noise incident perpendicularly to shield pattern 140 but also the noise incident from the oblique direction can be shielded. As a result, the superimposition of the noise on analog signal wiring group 120, digital signal wiring group 130, control element 101, the circuit wiring (not illustrated), and the electronic components can be prevented.

Shield pattern 140 equivalent to the substrate size in the layer different from the wiring layer of digital signal wiring group 130 is included as the difference from the first modification described above, so that spike-like noise generated by the switching operation of switching elements 7a, 7b, 7c, 7d is hardly superimposed on the control signal. As a result, erroneous control of switching elements 7a, 7b, 7c, 7d due to waveform distortion of the control signal can be prevented.

Figure 18:
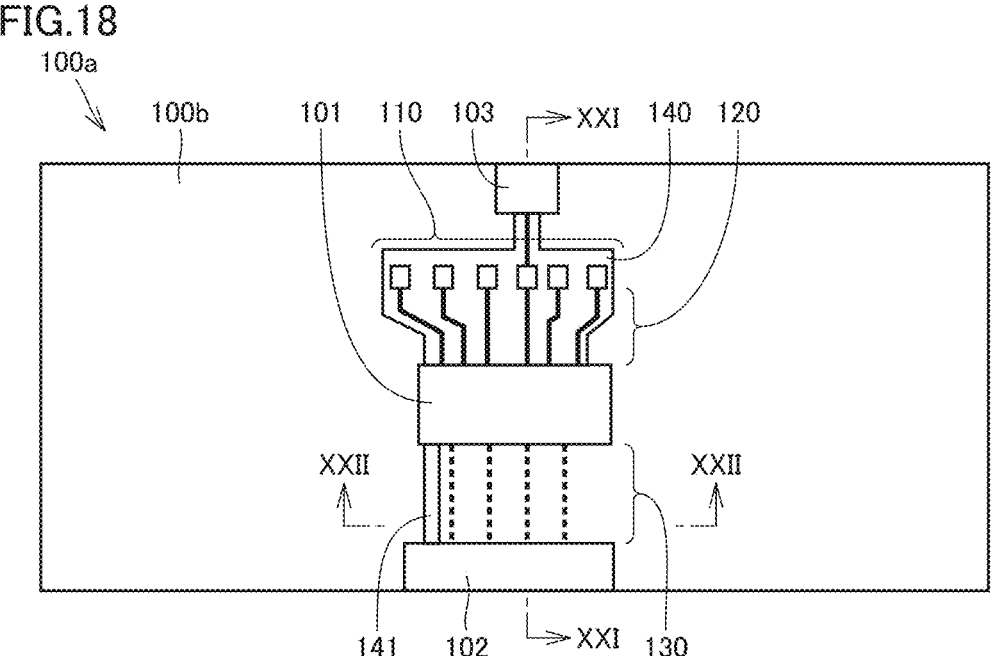
FIG. 18 is a perspective view illustrating a control circuit module according to a third modification of the first embodiment.
Figure 19:
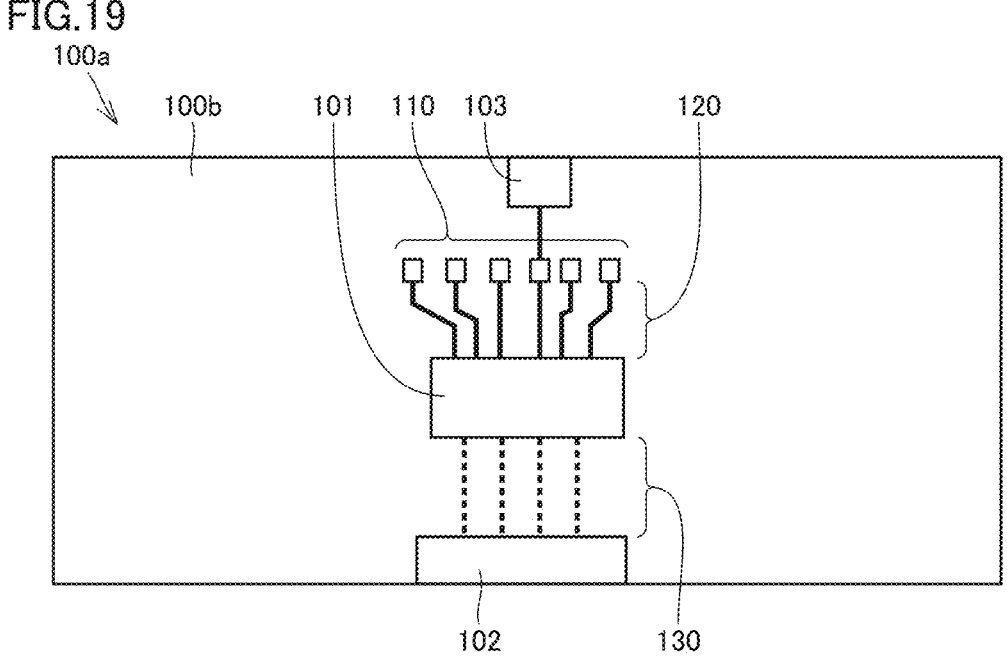
FIG. 19 is a top view illustrating a surface of the control circuit module of the third modification of the first embodiment.
Figure 20:
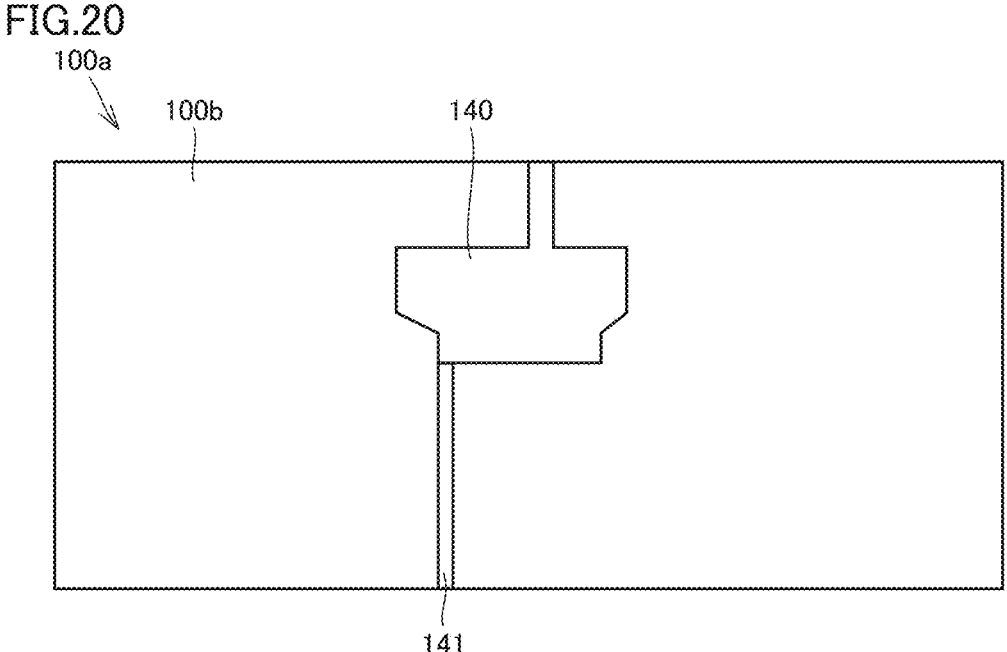
FIG. 20 is a top view illustrating a back surface of the control circuit module of the third modification of the first embodiment.
Figure 21:
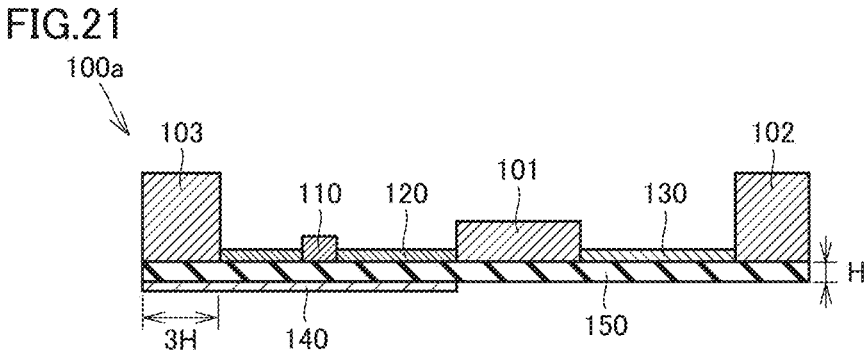
FIG. 21 is a sectional view taken along a line XXI-XXI in FIG. 18.
Figure 22:
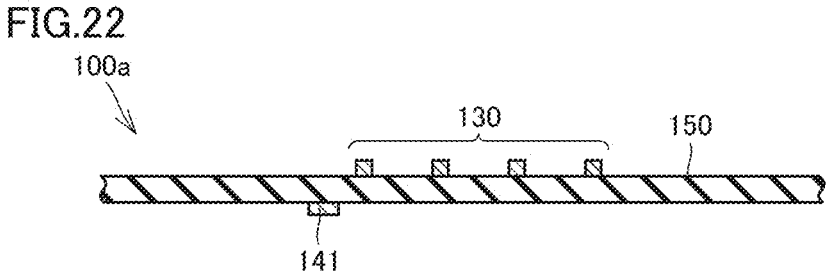
FIG. 22 is a sectional view taken along a line XXII-XXII in FIG. 18.

With reference to FIGS. 5 and 18 to 22, a third modification of the first embodiment will be described. FIG. 18 is a perspective view illustrating control circuit module 100a of the third modification of the first embodiment. FIG. 19 is a top view illustrating the surface of the control circuit module. FIG. 20 is a top view illustrating the back surface of the control circuit module. FIG. 21 is a sectional view taken along a line XXI-XXI in FIG. 18. Focusing on the difference from the first embodiment, the description of the same configuration, operation, and effect will not be repeated.

Power conversion device 1 of the third modification of the first embodiment is different from power conversion device 1 of the first embodiment in that first printed board 41 on which switching elements 7a, 7b, 7c, 7d are mounted includes the circuit wiring having the same potential as shield pattern 140 of control circuit board 100b, and control circuit board 100b includes extended shield pattern 141 electrically connecting the circuit wiring of first printed board 41 and shield pattern 140.

First printed board 41 includes a circuit wiring (first printed board circuit wiring 41a) having the same potential as shield pattern 140. Control circuit board 100b includes an extended shield pattern 141. Shield pattern 140 is electrically connected to the circuit wiring (first printed board circuit wiring 41a) and extended shield pattern 141.

Extended shield pattern 141 is a circuit wiring connecting between connection member 102 and shield pattern 140 in order to electrically connect shield pattern 140 of control circuit board 100b and the circuit wiring having the same potential as shield pattern 140 of first printed board 41. The wiring layer, the wiring width, and the wiring of extended shield pattern 141 are desirably routed in the shortest with the wiring layer same as the wiring layer of shield pattern 140 and the wiring width covering the wiring region of digital signal wiring group 130. However, the wiring is not limited thereto as long as connection member 102 and shield pattern 140 can be electrically connected as illustrated in FIG. 18.

When extended shield pattern 141 is included, in addition to the effects described in the first embodiment, shield pattern 140 of control circuit board 100b can be connected to the circuit wiring (first printed board circuit wiring 41a) having the same potential as stable shield pattern 140 of first printed board 41 with little potential fluctuation at a plurality of points together with reference GND wiring 105. Thus, the impedance of shield pattern 140 is reduced, so that the function of shield pattern 140 as the electrostatic shield is improved. Accordingly, the effect of shielding the electric field is enhanced.

In addition, the effect of reducing the switching noise superimposed on digital signal wiring group 130 is reduced by including extended shield pattern 141. The spike-like noise generated by switching elements 7a, 7b, 7c, 7d is superimposed on digital signal wiring group 130 that propagates the control signal controlling switching elements 7a, 7b, 7c, 7d. Because extended shield pattern 141 is electrically connected to the circuit wiring on first printed board 41 on which switching elements 7a, 7b, 7c, 7d are mounted, the extended shield pattern also functions as a path feeding back the noise superimposed on digital signal wiring group 130 to switching elements 7a, 7b, 7c, 7d. Thus, the noise superimposed on digital signal wiring group 130 can be prevented from being secondarily coupled to control element 101, analog signal wiring group 120, and the like close to digital signal wiring group 130. Furthermore, when extended shield pattern 141 includes the circuit wiring that covers the wiring region of digital signal wiring group 130 in different layers, the parasitic inductance of digital signal wiring group 130 can be reduced, so that the mutual inductance with the electronic components included in first printed board 41 or second printed board 51 and the wiring related to the electronic components is reduced. Thus, the inductive coupling between digital signal wiring group 130 and switching elements 7a, 7b, 7c, 7d and the like is prevented, so that the amount of noise superimposed on digital signal wiring group 130 can be prevented.

Second Embodiment

With reference to FIGS. 6 and 23 to 29, power conversion device 1 according to a second embodiment will be described. The second embodiment has the same configuration, operation, and effect as those of the first embodiment described above unless otherwise specified. Consequently, the same components as those in the first embodiment are denoted by the same reference numerals, and the description thereof will not be repeated.

Figure 23:
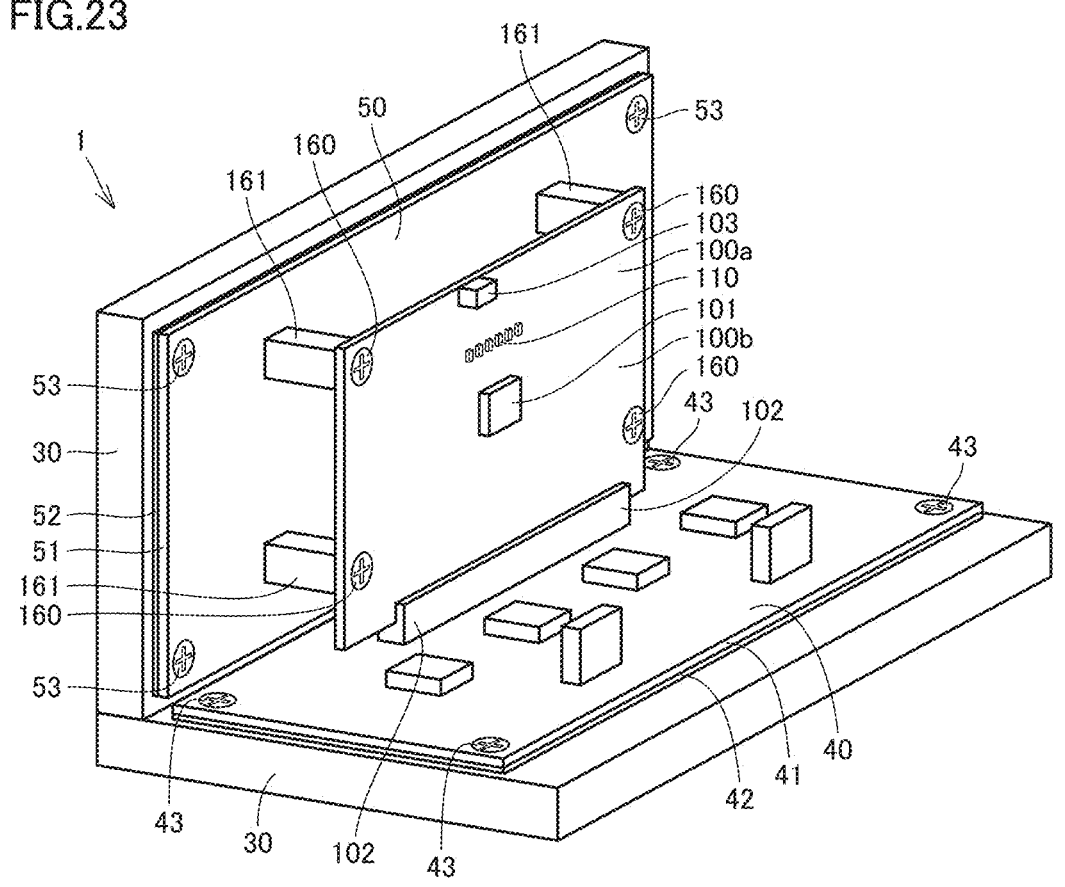
FIG. 23 is a perspective view illustrating a power conversion device according to a second embodiment.
Figure 24:
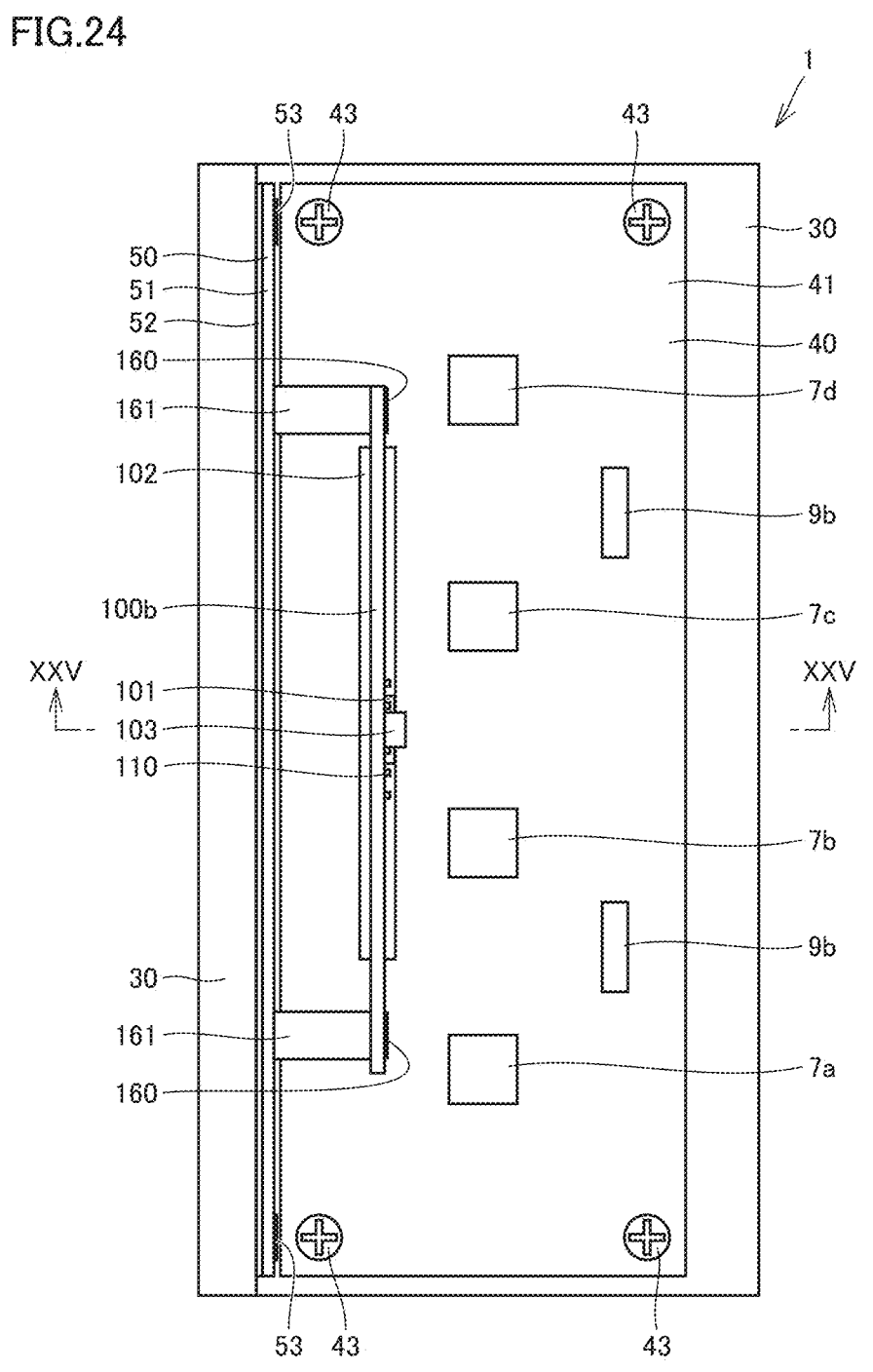
Figure 25:
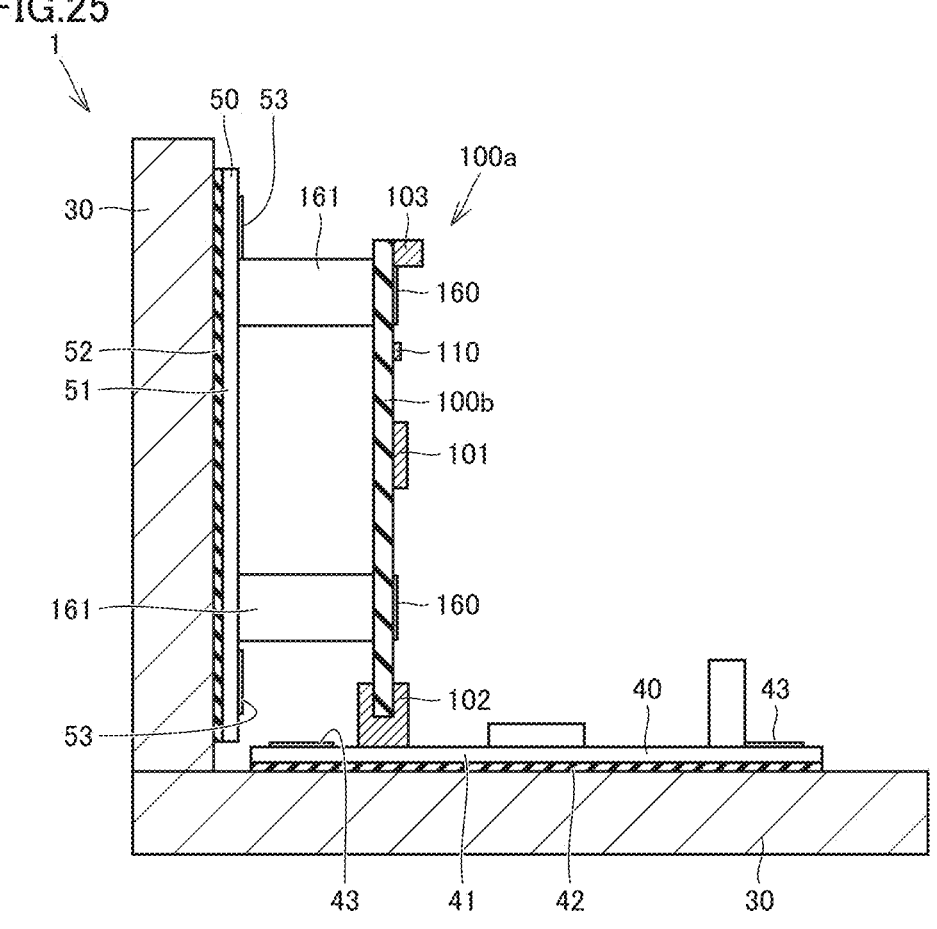
FIG. 25 is a sectional view taken along a line XXV-XXV in FIG. 24.

Power conversion device 1 of the second embodiment basically has the same configuration as power conversion device 1 of the first embodiment. FIG. 23 is a perspective view illustrating power conversion device 1 of the second embodiment. FIG. 24 is a top view illustrating power conversion device 1 of the second embodiment. FIG. 25 is a sectional view taken along a line XXV-XXV in FIG. 24. FIGS. 26 to 29 illustrate control circuit module 100a of the second embodiment. Power conversion device 1 of the second embodiment is different from the first embodiment in that power conversion device 1 of the second embodiment includes a fixing member 160, a spacer 161, extended shield pattern 141 of control circuit module 100a, via 142, and a land 143.

Second printed board 51 includes a circuit wiring (second printed board circuit wiring 51a) having the same potential as shield pattern 140. Shield pattern 140 is electrically connected to the circuit wiring (second printed board circuit wiring 51a) and extended shield pattern 141.

Fixing member 160 and spacer 161 are used to fix control circuit module 100a to second printed board module 50 opposite to control circuit module 100a. The material of fixing member 160 and spacer 161 is not limited. In addition, the presence or absence of extended shield pattern 141, via 142, and land 143 is not limited. Accordingly, when fixing member 160 and spacer 161 are electrically connected in order to have the same potential as the circuit wiring provided on second printed board 51, metallic fixing member 160 and metallic spacer 161 may be used. On the other hand, fixing member 160 and spacer 161 made of a non-metal such as a resin may be used as long as the wiring specification does not have the same potential. In other words, fixing member 160 and spacer 161 may be used only for fixing according to the specifications of the product, or may be electrically connected in addition to fixing. As described in the third modification of the first embodiment, shield pattern 140 may be connected to the circuit wiring on the first printed board through extended shield pattern 141 and connection member 102.

According to the second embodiment, control circuit module 100a is fixed to second printed board module 50 using fixing member 160 and spacer 161, so that vibration resistance is enhanced. Furthermore, fixing member 160 and spacer 161 are fixed to second printed board 51 at equal intervals in a balanced manner without being biased, so that control circuit module 100a is also resistant to deflection. Because control circuit module 100a is fixed to second printed board module 50, the connection between control circuit module 100a and first printed board module 40 does not necessarily need to be structurally firmly fixed, but only needs to transmit the control signal. In other words, a cable or the like can also be used as connection member 102.

The contribution to control circuit module 100a is electrically the same as that in the first embodiment when fixing member 160 and spacer 161 are made of the non-metal, so that it is assumed that fixing member 160 and spacer 161 are made of metal in the following description.

Figure 26:
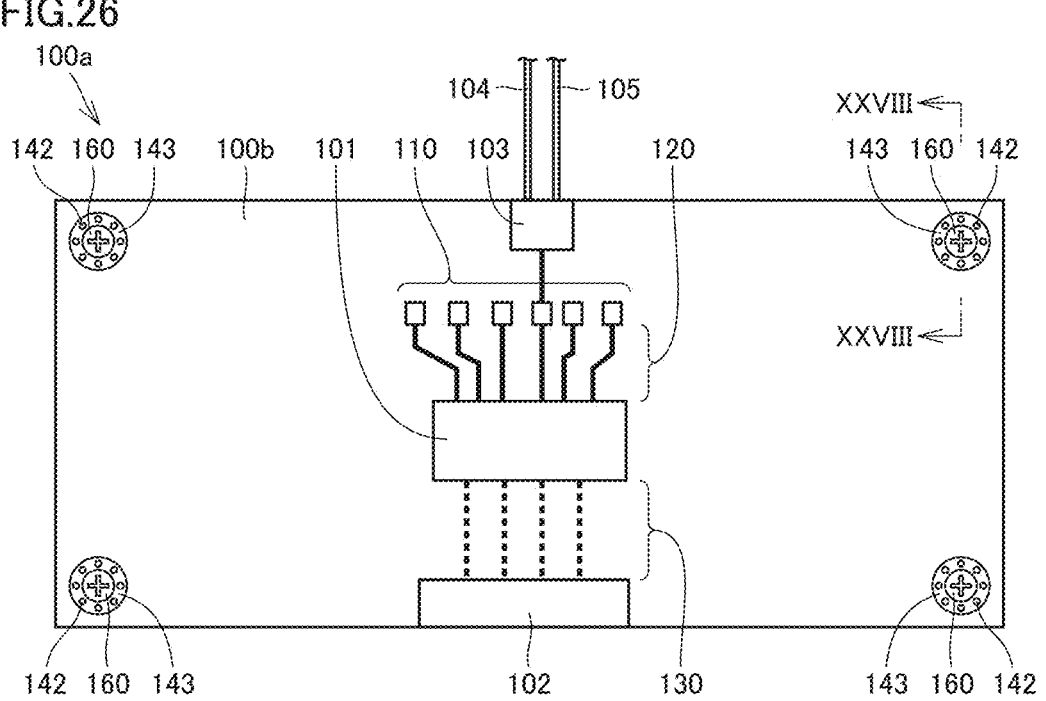
FIG. 26 is a top view illustrating a surface of a control circuit module of the second embodiment.
Figure 27:
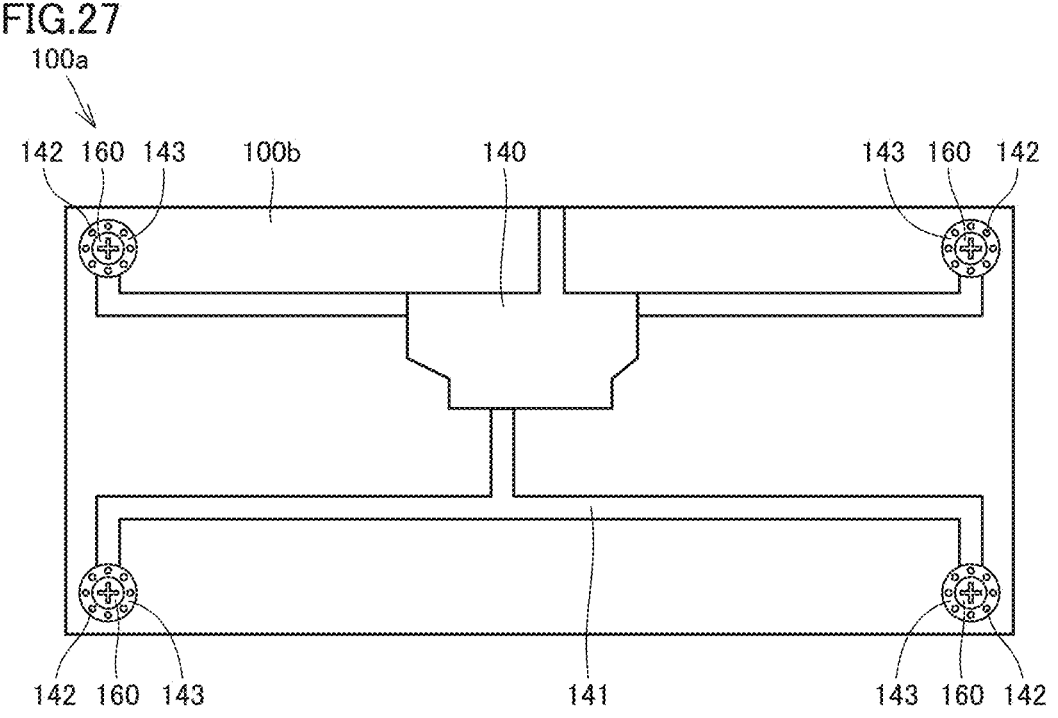
FIG. 27 is a top view illustrating a back surface of the control circuit module of the second embodiment.
Figure 28:
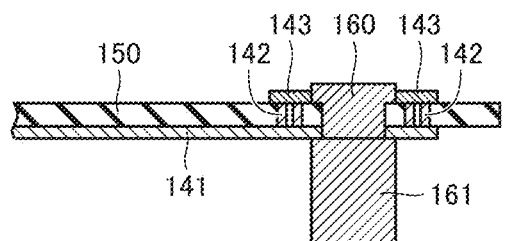
FIG. 28 is a sectional view taken along a line XXVIII-XXVIII in FIG. 26.
Figure 29:
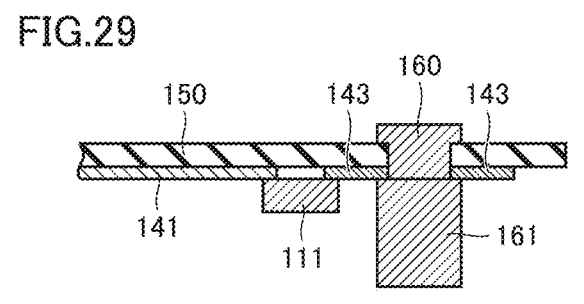

With reference to FIGS. 26 to 29, control circuit module 100a of the second embodiment will be described. FIG. 26 is a top view illustrating the surface of control circuit module 100a of the second embodiment. FIG. 27 is a top view illustrating the back surface of control circuit module 100a of the second embodiment. FIG. 28 is a sectional view taken along a line XXVIII-XXVIII in FIG. 26. FIG. 29 is a sectional view corresponding to FIG. 28 illustrating a modification of control circuit module 100a of the second embodiment. Control circuit module 100a of the second embodiment is different from the first embodiment in that control circuit board 100b includes fixing member 160, via 142, and land 143, and in that extended shield pattern 141 is deformed accordingly.

Via 142 electrically connects land 143 on the surface layer of control circuit board 100b and extended shield pattern 141 on the layer different from land 143.

Land 143 is the circuit wiring connecting electrically extended shield pattern 141 to fixing member 160 through via 142. When spacer 161 can be electrically connected to and structurally fixed to control circuit board 100b without fixing member 160, via 142 and land 143 are not necessarily provided, but may be arbitrarily provided according to the connection method.

Extended shield pattern 141 may be a combination of the examples illustrated in the first embodiment, but is not limited to the specifications illustrated in the drawings. In order to lower the impedance between fixing member 160 and shield pattern 140, it is desirable to increase the wiring width of extended shield pattern 141, and it is more desirable to dispose the extended shield pattern as a solid on one surface of control circuit board 100b. Extended shield pattern 141 may be connected to connection member 102 and the GND provided on first printed board 41. In addition, as illustrated in FIG. 29, extended shield pattern 141 and land 143 may be electrically connected by a passive electronic component 111, for example, a capacitor.

The present embodiment is structurally excellent from the viewpoint of the vibration resistance and the fixation described above in addition to the effects of the first embodiment. Furthermore, shield pattern 140 of control circuit board 100b can be connected to the circuit wiring (second printed board circuit wiring 51a) having the same potential as stable shield pattern 140 of second printed board 51 with little potential fluctuation at a plurality of points. Thus, the impedance of shield pattern 140 is reduced, so that the function of shield pattern 140 as the electrostatic shield is improved. Accordingly, the effect of shielding the electric field is enhanced.

Third Embodiment

Figure 30:
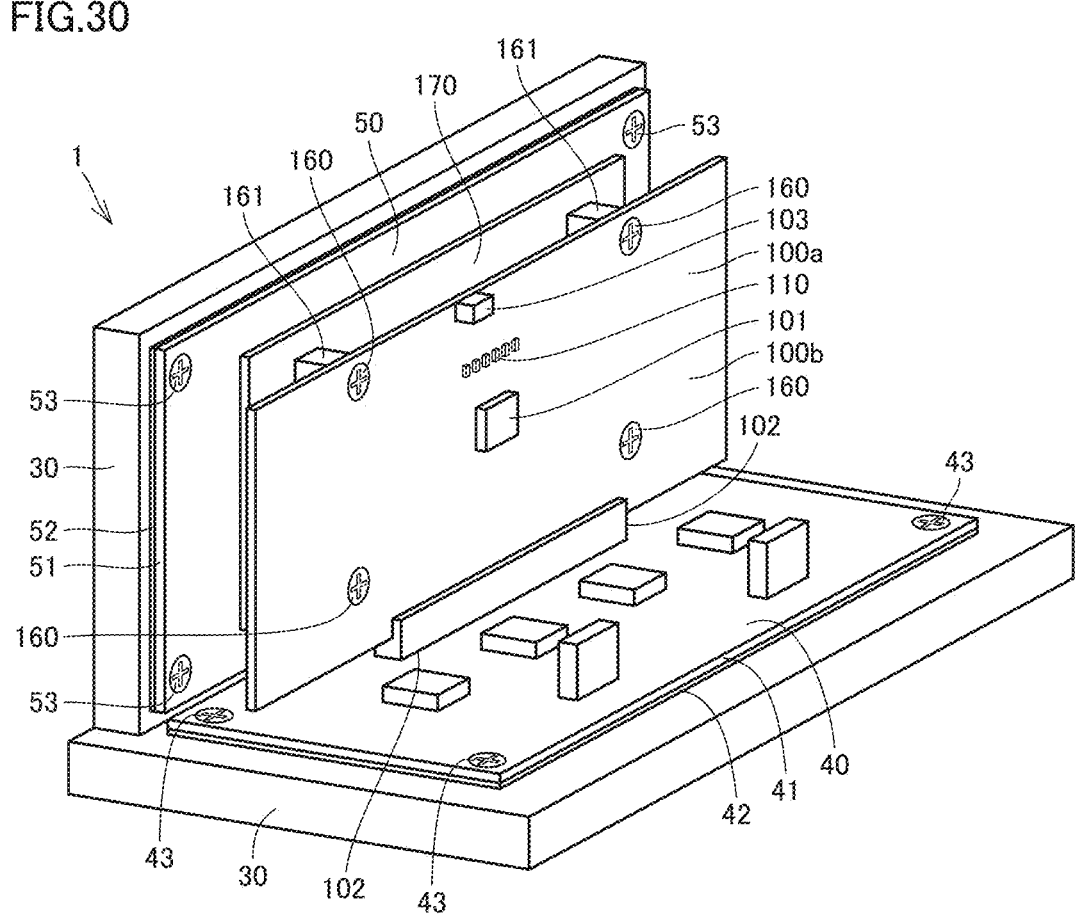
FIG. 30 is a perspective view illustrating a power conversion device according to a third embodiment.
Figure 31:
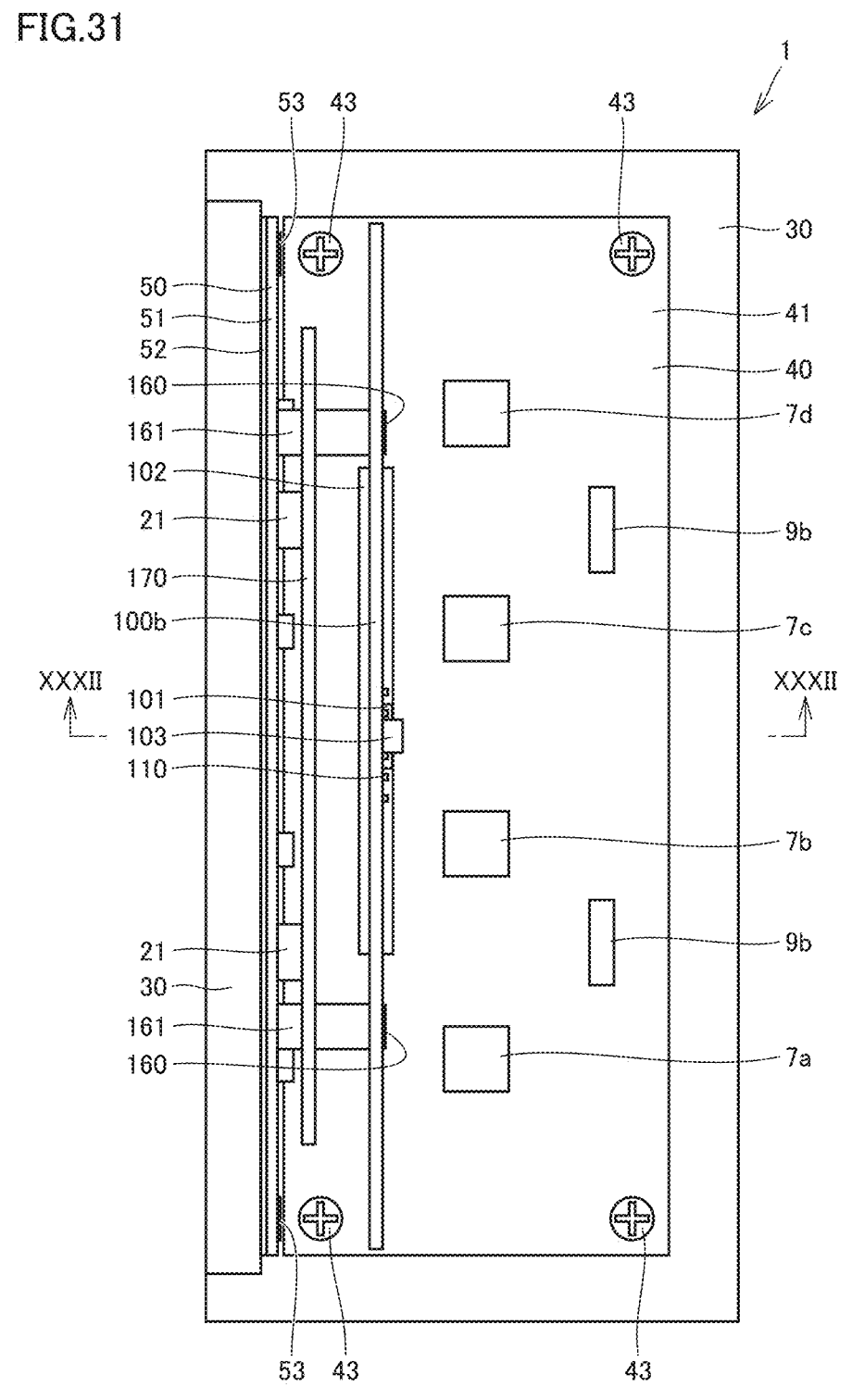
Figure 32:
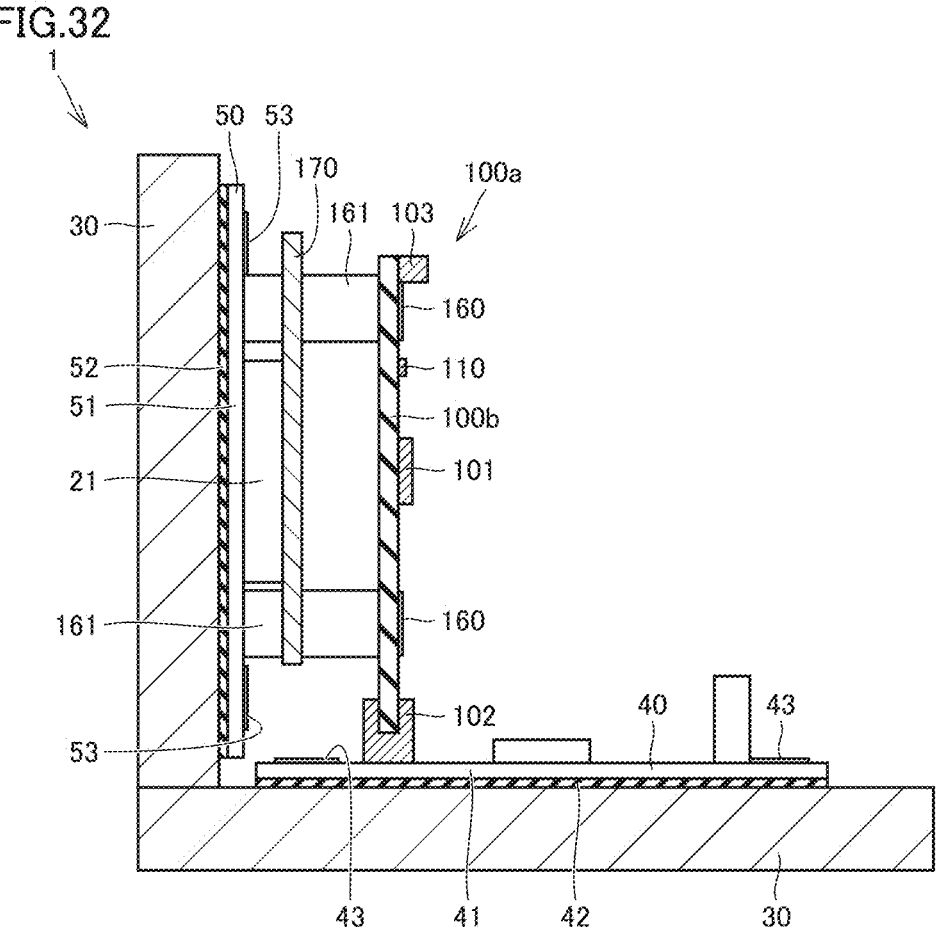
FIG. 32 is a sectional view taken along a line XXXII-XXXII in FIG. 31.

With reference to FIGS. 30 to 32, power conversion device 1 according to a third embodiment will be described.

The third embodiment has the same configuration, operation, and effect as those of the first embodiment and second embodiments described above unless otherwise specified. Consequently, the same components as those in the first and second embodiments are denoted by the same reference numerals, and the description thereof will not be repeated.

Power conversion device 1 of the third embodiment basically has the same configuration as power conversion device 1 of the first and second embodiments. FIG. 30 is a perspective view illustrating power conversion device 1 of the third embodiment. FIG. 31 is a top view illustrating power conversion device 1 of the third embodiment. FIG. 32 is a sectional view taken along a line XXXII-XXXII in FIG. 31. Power conversion device 1 of the third embodiment is different from power conversion device 1 of the first and second embodiments in that power conversion device 1 of the third embodiment includes a pressing plate 170.

Pressing plate 170 is thermally connected to an electronic component mounted on second printed board 51, for example, a high-heat generating component such as transformer circuit 3 and smoothing coil 20 (see FIG. 1), and is configured to cool the electronic component. Pressing plate 170 presses and fixes the core material constituting transformer circuit 3 and smoothing coil 20 to second printed board 51. Pressing plate 170 is disposed between second printed board 51 and control circuit board 100*b*. Pressing plate 170 is disposed substantially horizontally with second printed board 51. Pressing plate 170 is configured to press the electronic component against second printed board 51. Pressing plate 170 is configured to be opposite to second printed board 51 and control circuit board 100*b*. Pressing plate 170 has thermal conductivity greater than or equal to 1.0 W/(m·K), preferably greater than or equal to 10.0 W/(m·K), and more preferably greater than or equal to 100.0 W/(m·K). Pressing plate 170 is formed of a metal material such as copper, iron, aluminum, an iron alloy, or an aluminum alloy. Pressing plate 170 may include a dissipation fin or the like in order to promote the heat dissipation to the surrounding atmosphere. In addition, pressing plate 170 is not necessarily integrally molded, but may be formed by combining a plurality of metal plates to connect the metal plates. An insulating member similar to first insulating member 42 and second insulating member 52 may be provided between pressing plate 170 and the high-heat generating component.

According to the third embodiment, in addition to the effects of the first and second embodiments, the heat dissipation of the electronic component thermally connected to pressing plate 170 can be enhanced, and the electronic component can be fixed. Furthermore, with respect to control circuit module 100*a*, pressing plate 170 also functions as a shield that shields the noise. In particular, the noise generated by the electronic component fixed by pressing plate 170 is effectively shielded. Consequently, the superimposition of the noise on control circuit module 100*a* can be prevented. Accordingly, the electronic component that generates the noise and control circuit board 100*b* can be mounted close to each other. As a result, the noise is less likely to be superimposed on analog signal wiring group 120 and control element 101 of control circuit module 100*a*, so that power conversion device 1 can be downsized while preventing the malfunction of power conversion device 1.

Fourth Embodiment

With reference to FIGS. 33 to 36, power conversion device 1 according to a fourth embodiment will be described. The fourth embodiment has the same configuration, operation, and effect as those of the first to third embodiments described above unless otherwise specified. Consequently, the same components as those in the first and second embodiments are denoted by the same reference numerals, and the description thereof will not be repeated.

Figure 33:
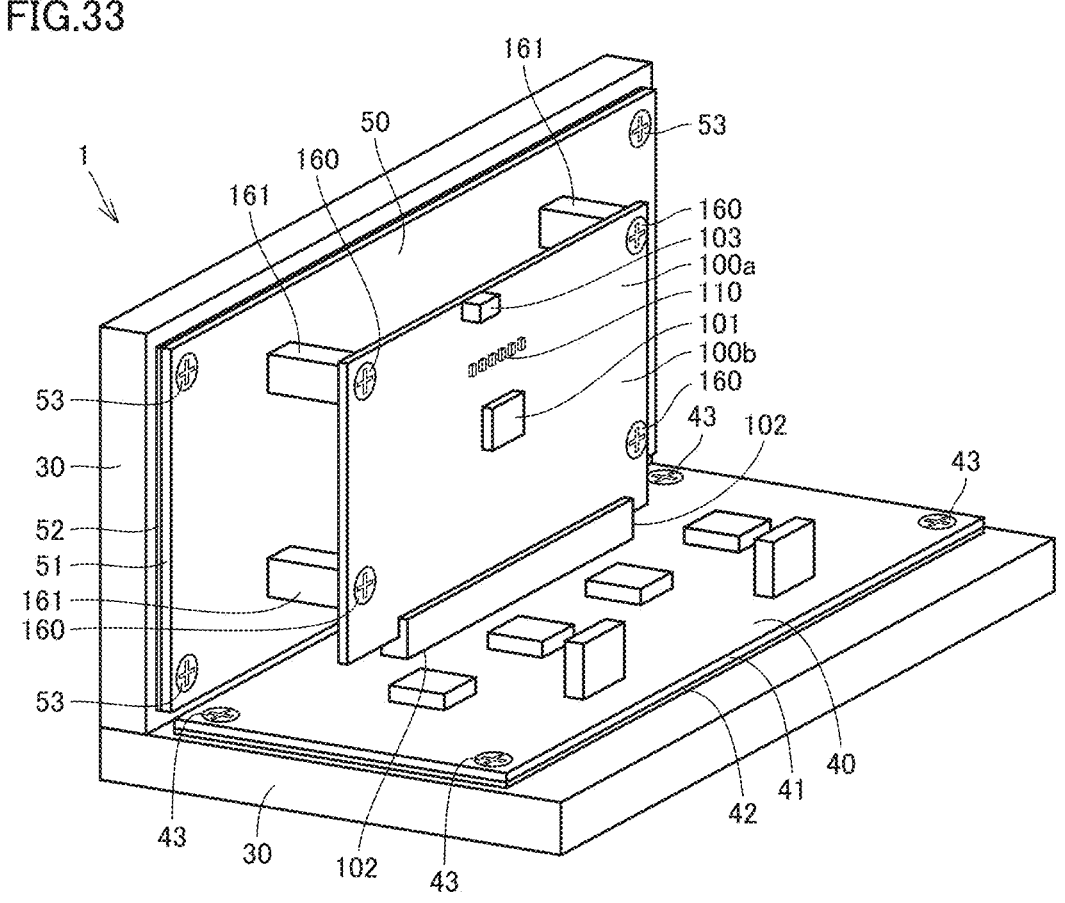
FIG. 33 is a perspective view illustrating a power conversion device according to a fourth embodiment.
Figure 34:
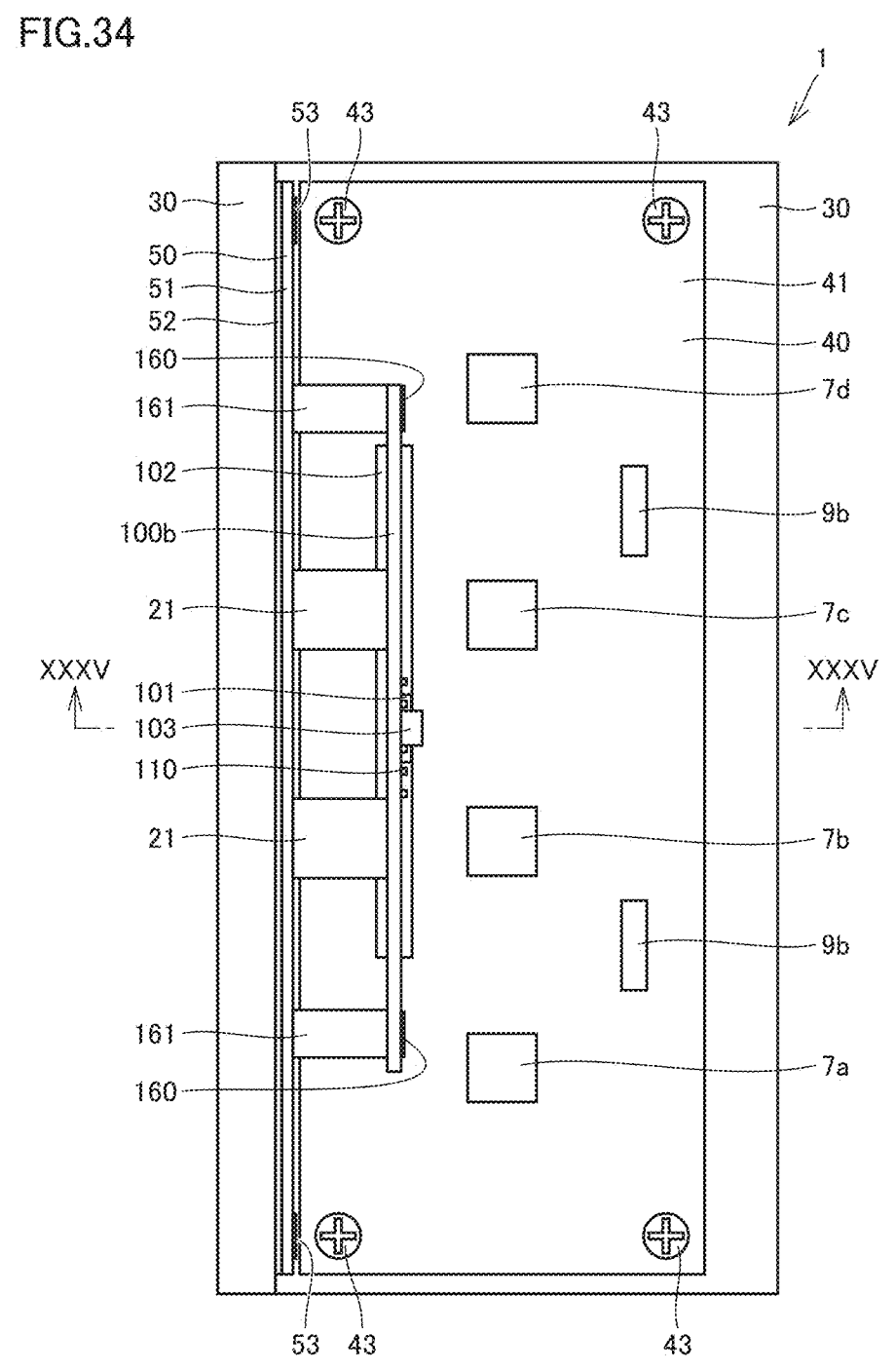
Figure 35:
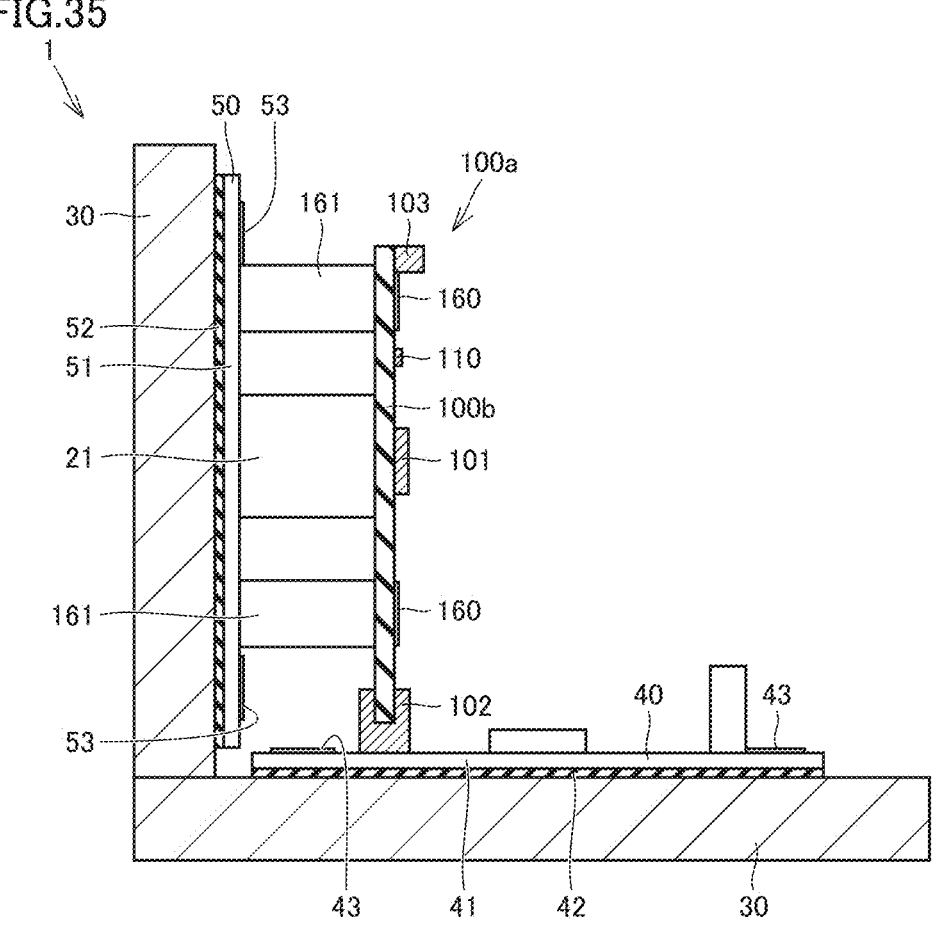
FIG. 35 is a sectional view taken along a line XXXV-XXXV in FIG. 34.
Figure 36:
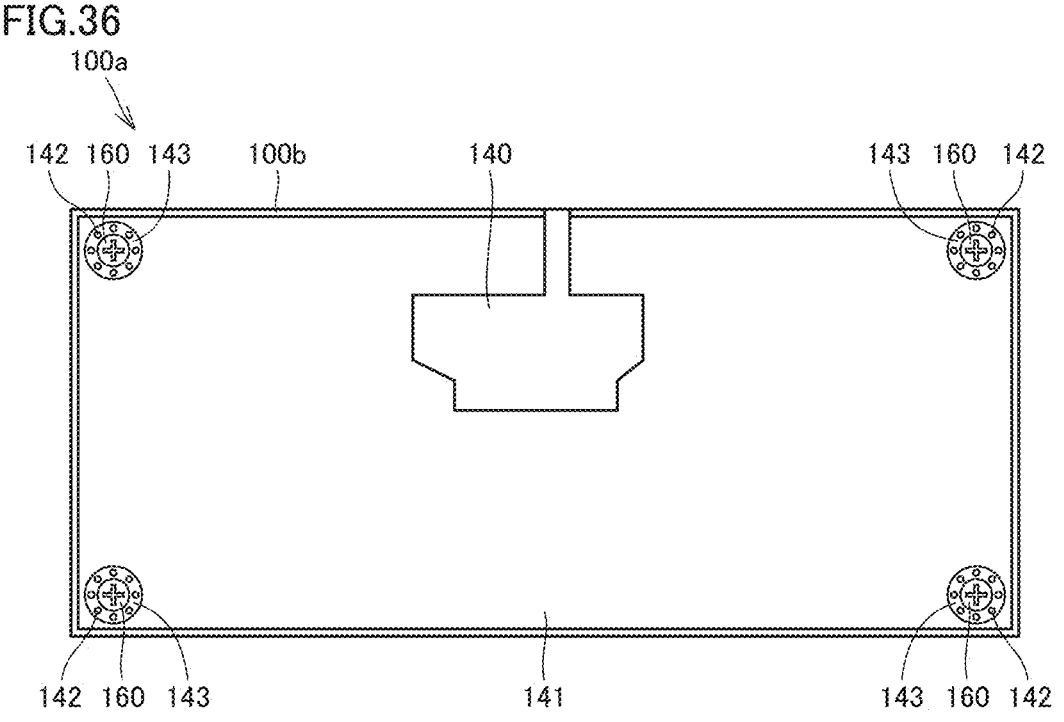
FIG. 36 is a top view illustrating a back surface of the control circuit module of the fourth embodiment.

Power conversion device 1 of the fourth embodiment basically has the same configuration as power conversion device 1 of the first to third embodiments. FIG. 33 is a perspective view illustrating power conversion device 1 of the fourth embodiment. FIG. 34 is a top view illustrating power conversion device 1 of the fourth embodiment. FIG. 35 is a sectional view taken along a line XXXV-XXXV in FIG. 34. FIG. 36 is a top view illustrating the back surface of control circuit module 100*a* of the fourth embodiment. Power conversion device 1 of the fourth embodiment is different from power conversion device 1 of the third embodiment in that the electronic component on second printed board 51 are radiated and fixed by control circuit board 100*b* instead of pressing plate 170. In order to efficiently thermally diffuse and dissipate heat from the electronic component on second printed board 51, extended shield pattern 141 on control circuit board 100*b* is disposed on the substrate surface opposite to second printed board 51.

Control circuit module 100*a* of the fourth embodiment is mounted to be opposite to the printed board on which the electronic component that needs to be radiated and fixed is mounted, for example, second printed board 51 in FIGS. 33 to 35. Extended shield pattern 141 of control circuit module 100*a* is provided on the surface opposite to second printed board 51.

Although the shape and the wiring region of extended shield pattern 141 are not limited, in order to efficiently dissipate the heat from the electronic component mounted on second printed board 51, as illustrated in FIG. 36, it is desirable that extended shield pattern 141 has a larger area and that the circuit wiring is provided on one surface of control circuit board 100*b*. Furthermore, an insulating member similar to first insulating member 42 and the second insulating member may be used between extended shield pattern 141 and the electronic component in order to insulate and thermally densely connect extended shield pattern 141 and the electronic component.

Control circuit board 100*b* is configured to press the electronic component mounted on second printed board 51 against second printed board 51. Control circuit board 100*b* is disposed substantially horizontally with second printed board 51.

According to the fourth embodiment, in addition to the effects of the first and second embodiments, the electronic component can be radiated and fixed without pressing plate 170 of the third embodiment. Because pressing plate 170 of the third embodiment is not required, second printed board 51 and control circuit board 100*b* can be mounted close to each other by the volume of pressing plate 170. Thus, power conversion device 1 can be further downsized.

Fifth Embodiment

With reference to FIGS. 37 to 40, power conversion device 1 according to a fifth embodiment will be described. The fifth embodiment has the same configuration, operation, and effect as those of the first to fourth embodiments described above unless otherwise specified. Consequently, the same components as those in the first to fourth embodiments are denoted by the same reference numerals, and the description thereof will not be repeated.

Figure 37:
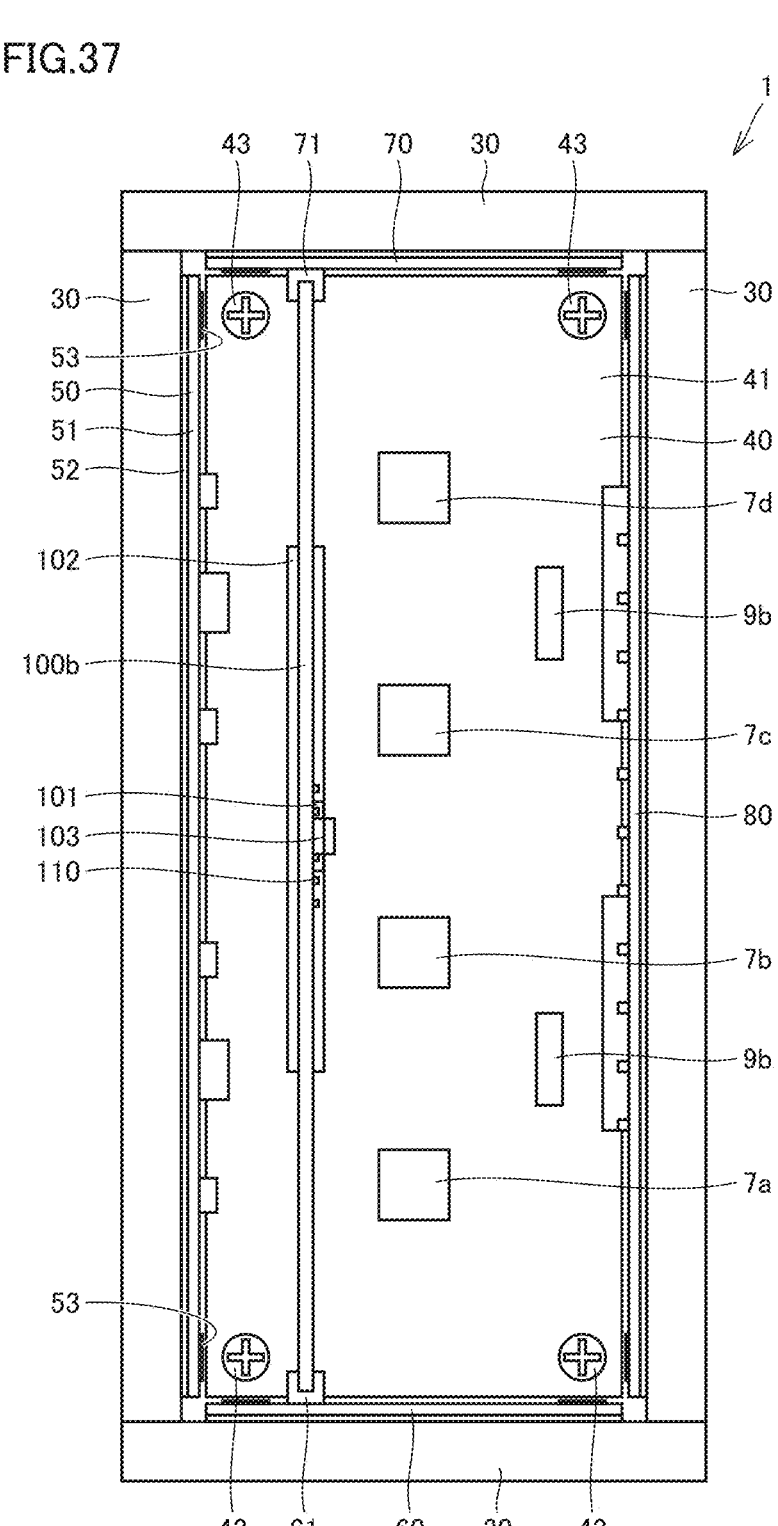
FIG. 37 is a top view illustrating a power conversion device according to a fifth embodiment.
Figure 38:
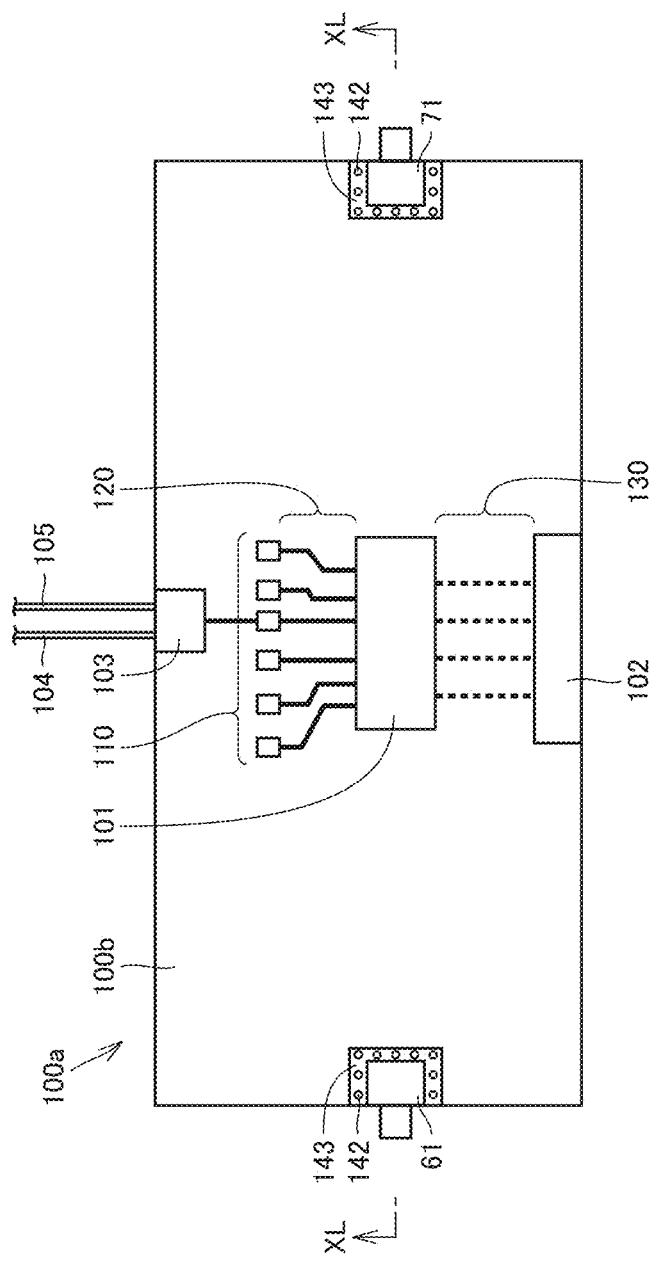
FIG. 38 is a top view illustrating a surface of a control circuit module of the fifth embodiment.
Figure 39:
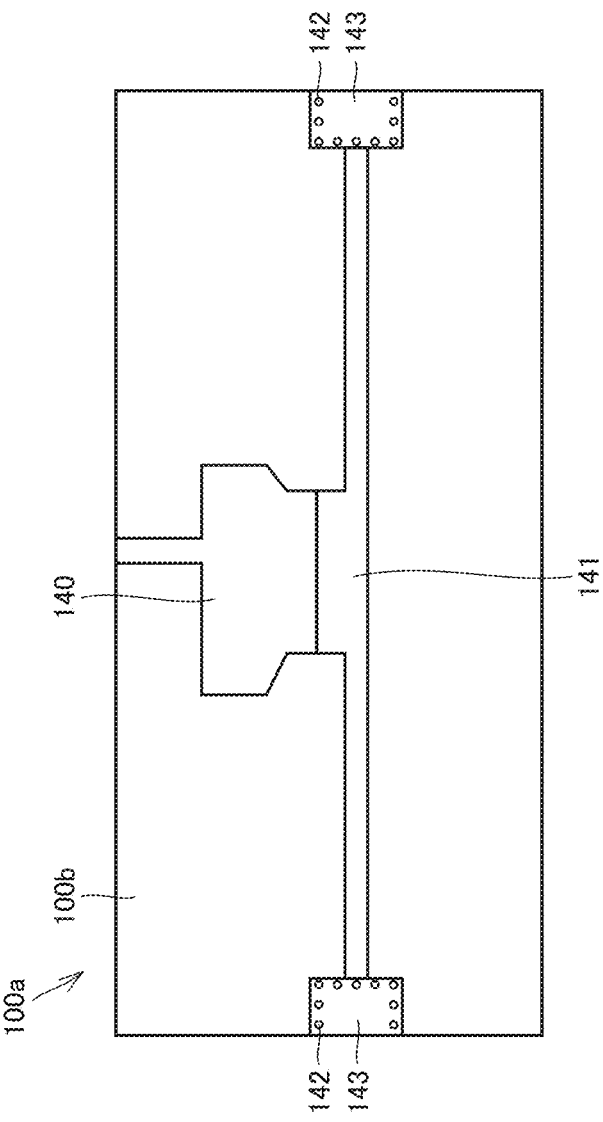
FIG. 39 is a top view illustrating a back surface of the control circuit module of the fifth embodiment.
Figure 40:
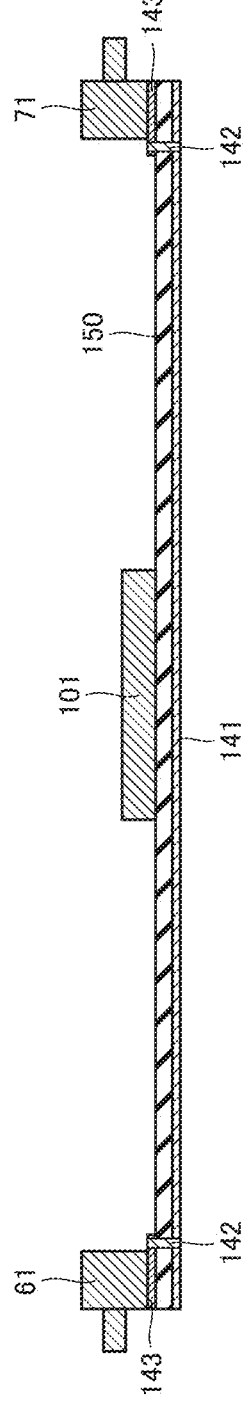
FIG. 40 is a sectional view taken along a line XL-XL in FIG. 38.

Power conversion device 1 of the fifth embodiment basically has the same configuration as power conversion device 1 of the first to fourth embodiments. FIG. 37 is a top view illustrating power conversion device 1 of the fifth embodiment. FIG. 38 is a top view illustrating the surface of control circuit module 100a of the fifth embodiment. FIG. 39 is a top view illustrating the back surface of control circuit module 100a of the fifth embodiment. FIG. 40 is a sectional view taken along a line XL-XL in FIG. 38.

Power conversion device 1 of the fifth embodiment is different from the first to fourth embodiments in that power conversion device 1 of the fifth embodiment includes a printed board module in which electronic components are mounted on the short side of control circuit board 100b, and includes the printed board module, a third connection member 61, a fourth connection member 71, via 142, and land 143.

As illustrated in FIG. 37, power conversion device 1 of the fifth embodiment includes casing 30, first printed board module 40, second printed board module 50, third printed board module 60, fourth printed board module 70, fifth printed board module 80, and control circuit module 100a. Third printed board module 60, fourth printed board module 70, and fifth printed board module 80 are fixed to casing 30 by the printed board, the insulating member, and the fixing member, respectively. These printed board modules are electrically connected by a harness (not illustrated) or the like.

In FIG. 37 that is the top view of the fifth embodiment, casing 30 has five surfaces, there are five printed board modules, and the printed board module is fixed to each of the inner walls of casing 30. This configuration is merely an example, and in addition to first printed board module 40, the printed board module on which the electronic component is mounted may be provided as connection destinations of third connection member 61 or fourth connection member 71, and the configuration does not depend on the number of surfaces of casing 30 and the number of printed board modules. However, in the description of the fifth embodiment, as illustrated in FIG. 38, it is assumed that box-shaped casing 30 having five surfaces, and first printed board module 40, second printed board module 50, third printed board module 60, fourth printed board module 70, and fifth printed board module 80 are provided on each surface. Control circuit module 100a is fixed to third printed board module 60 and fourth printed board module 70 by third connection member 61 and fourth connection member 71, respectively. Although they may or may not be electrically connected, here, the case where control circuit module 100a is electrically connected to third printed board module 60 and fourth printed board module 70 by third connection member 61 and fourth connection member 71 will be described.

Third connection member 61 fixes control circuit board 100b and third printed board module 60. Third connection member 61 connects the circuit wirings of control circuit board 100b and third printed board module 60 at the same potential. For example, third connection member 61 is an inter-board connector, a mounting socket, a finger, or a clip. In addition, third connection member 61 may be a connection member obtained by combining the connection member mounted on control circuit board 100b such as the inter-board connector and the printed board. Although third connection member 61 is one structure in FIG. 37, the third connection member 61 may be attached in a plurality of parts or provided on at least one side of control circuit board

100b connected to third printed board module 60 without being limited to the mounting position.

Fourth connection member 71 is basically similar to third connection member 61, but is different from third connection member 61 in that fourth connection member 71 is fixed to fourth printed board module 70, and that control circuit board 100b and the circuit wiring of the same potential of the fourth printed board module 70 are connected.

According to the fifth embodiment, in addition to the effect of the first embodiment, because control circuit board 100b can be fixed at a plurality of points, the vibration resistance is excellent. Furthermore, shield pattern 140 on control circuit board 100b can be connected not only to reference GND wiring 105 but also to third printed board module 60 and fourth printed board module 70 through extended shield pattern 141, third connection member 61, and fourth connection member 71. Thus, the impedance of shield pattern 140 with respect to casing 30 is reduced, so that the function of shield pattern 140 as the electrostatic shield is improved. Accordingly, the effect of shielding the electric field is enhanced.

Sixth Embodiment

Figure 41:
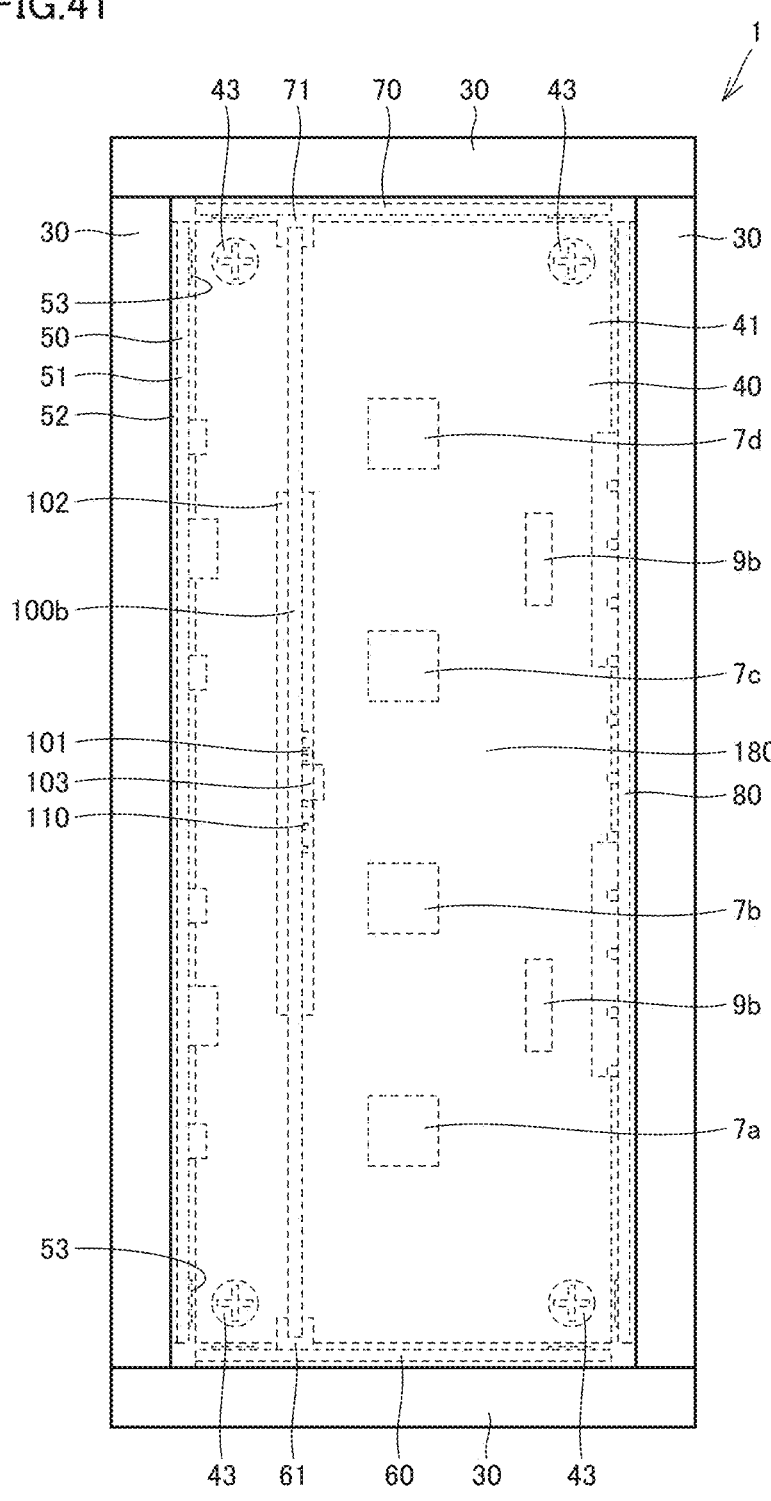
FIG. 41 is a top view illustrating a power conversion device according to a sixth embodiment.

Power conversion device 1 according to a sixth embodiment basically has the same configuration as power conversion device 1 of the first to fifth embodiments. FIG. 41 is a top view illustrating power conversion device 1 of the sixth embodiment. Power conversion device 1 of the sixth embodiment is different in that casing 30 has five surfaces, and that a space surrounded by casing 30 is filled with a sealing member 180.

Power conversion device 1 of the sixth embodiment includes box-shaped casing 30 having five surfaces, first printed board module 40 fixed to the inner wall of casing 30, second printed board module 50, third printed board module 60, fourth printed board module 70, fifth printed board module 80, control circuit module 100a, and sealing member 180. The number of printed board modules is not limited as long as the functions of power conversion device 1 can be implemented. Here, it is assumed that the number of fifth printed board modules 80 is five from first printed board module 40.

Sealing member 180 is filled in the space surrounded by casing 30. Specifically, sealing member 180 is filled in the space surrounded by box-shaped casing 30. Sealing member 180 seals the electronic components mounted on each of first printed board module 40, second printed board module 50, third printed board module 60, fourth printed board module 70, fifth printed board module 80, and control circuit module 100a.

Sealing member 180 may be made of a material having the thermal conductivity greater than or equal to 0.1 W/(m·K), preferably greater than or equal to 1.0 W/(m·K). Sealing member 180 is made of a material having volume resistivity greater than or equal to $1 \times 10^{10}$ Ω·m, preferably greater than or equal to $1 \times 10^{12}$ Ω·m, and more preferably greater than or equal to $1 \times 10^{14}$ Ω·m. In other words, sealing member 180 has an electric insulation property. Sealing member 180 may have the Young's modulus greater than or equal to 1 MPa. Sealing member 180 may be made of a resin material having elasticity. Sealing member 180 may be made of a resin material such as polyphenylene sulfide (PPS) and polyether ether ketone (PEEK), which are contain a thermally conductive filler. Sealing member 180 may be made of a rubber material such as silicone or urethane.

According to the sixth embodiment, the same effects as those of power conversion device 1 of the first to fifth embodiments can be obtained. Furthermore, in power conversion device 1 of the sixth embodiment, it is possible to form a heat dissipation path dissipating the heat generated by the circuit wiring formed on the surface or inside of the printed board and the heat generated by the electronic component mounted on the printed board to casing 30 through sealing member 180 as the heat dissipation path dissipating the heat. For this reason, the heat dissipation of power conversion device 1 can be improved with respect to the heat generated in the circuit wiring formed on the surface or inside of the printed board and the heat generated in the electronic component mounted on the printed board. As a result, power conversion device 1 can operate with high output.

In general, in order to prevent the creeping discharge between the electronic components, it is necessary to secure a creeping distance according to the voltage applied to each electronic component between the electronic components. In power conversion device 1 of the sixth embodiment, creeping discharge is hardly generated because sealing member 180 having the electric insulation property is filled between the electronic components. Consequently, the creeping distance between the electronic components can be shortened. Furthermore, since the spatial discharge is less hardly generated, the spatial distance between the printed boards can be shortened. Therefore, power conversion device 1 of the sixth exemplary embodiment can downsize first printed board module 40, second printed board module 50, third printed board module 60, fourth printed board module 70, and fifth printed board module 80 as compared with power conversion device 1 of the first to fifth embodiments. Furthermore, the spatial distance between the printed board module and control circuit module 100a can be shortened. As a result, power conversion device 1 of the sixth embodiment can be downsized.

When sealing member 180 is filled between the printed board and casing 30, the necessity of the insulating member disposed between the printed board and the coolant can be eliminated. Accordingly, the number of components constituting power conversion device 1 can be reduced.

Seventh Embodiment

Figure 42:
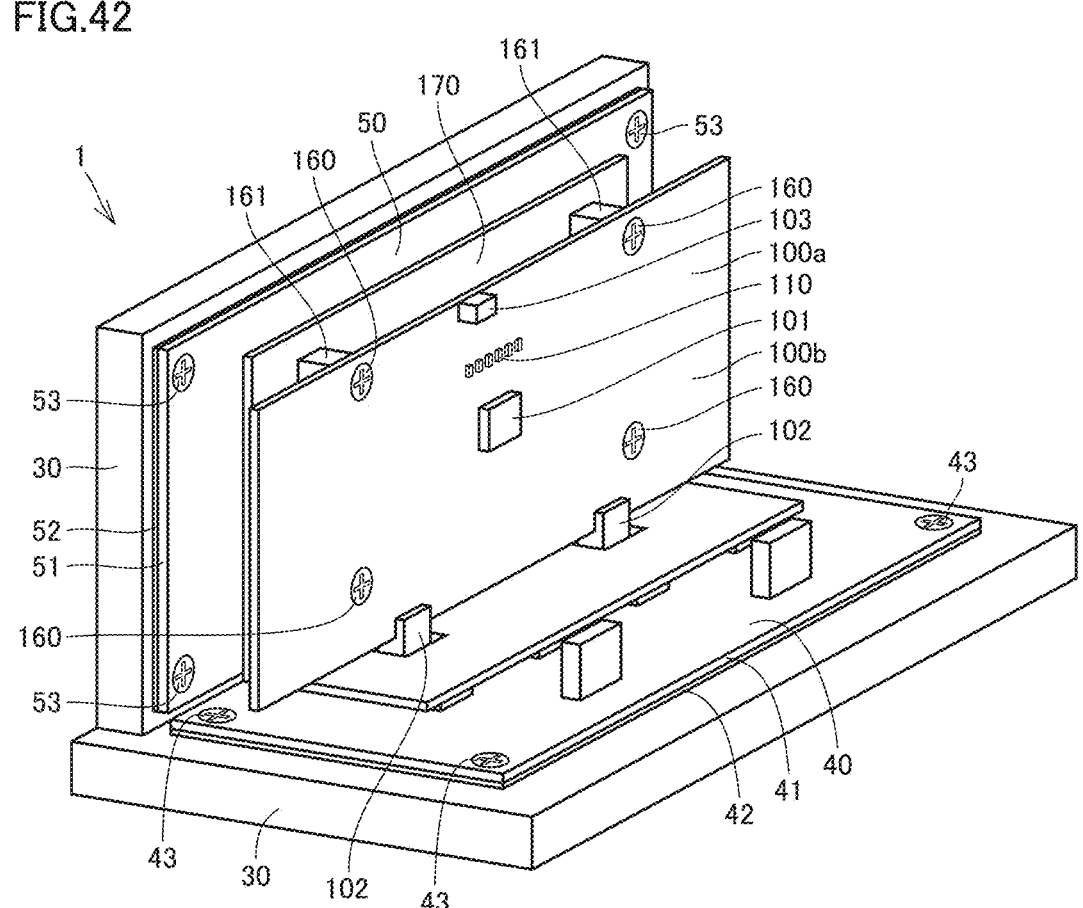
FIG. 42 is a perspective view illustrating a power conversion device according to a seventh embodiment.
Figure 43:
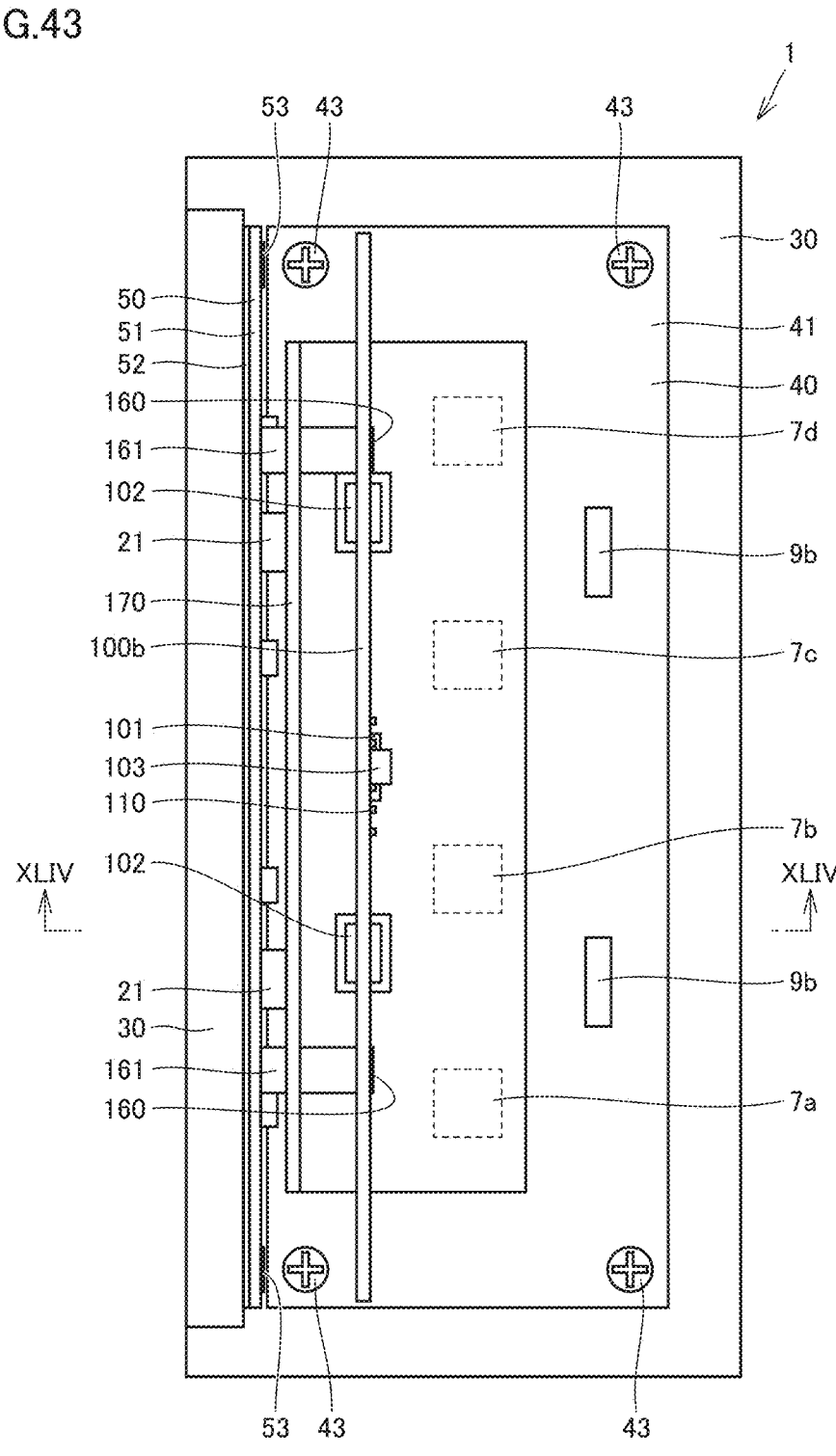
FIG. 43 is a top view illustrating the power conversion device of the seventh embodiment.
Figure 44:
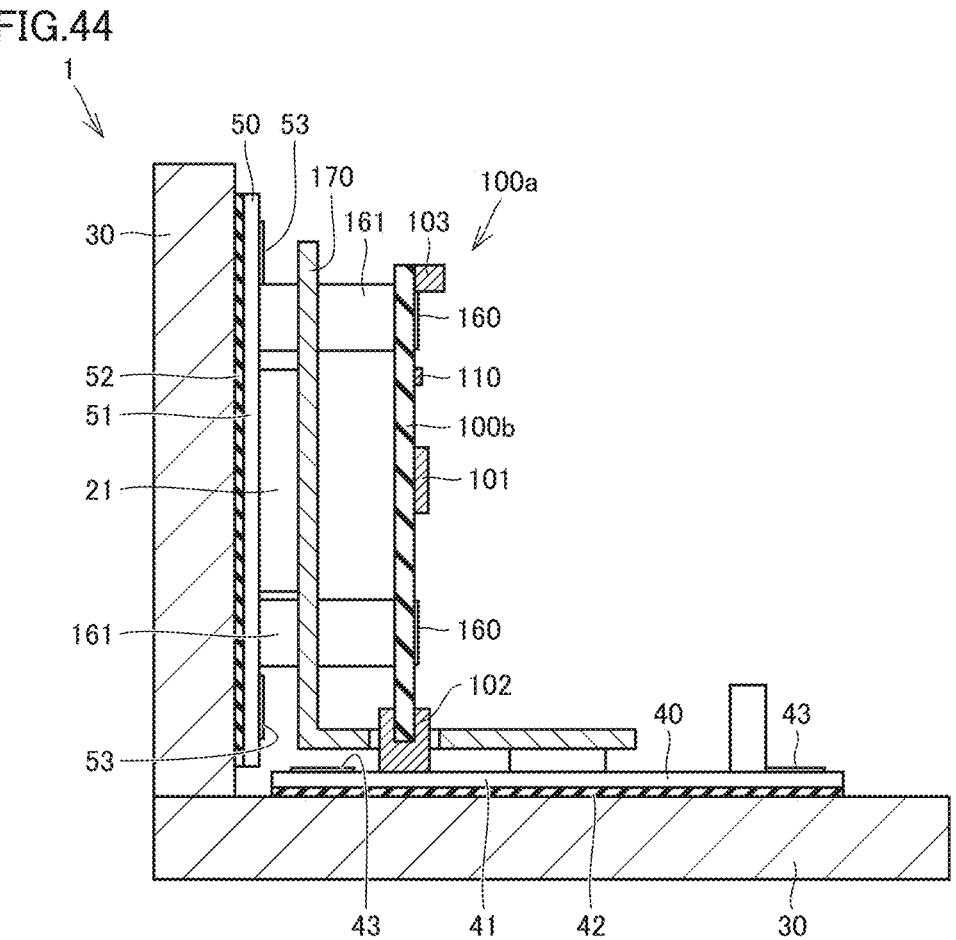
FIG. 44 is a sectional view taken along a line XLIV-XLIV in FIG. 43.

Power conversion device 1 according to a seventh embodiment is basically a modification of the third embodiment. Power conversion device 1 of the seventh embodiment basically has the same configuration as power conversion device 1 of the first and second embodiments. FIG. 42 is a perspective view illustrating power conversion device 1 of the seventh embodiment. FIG. 43 is a top view illustrating power conversion device 1 of the seventh embodiment. FIG. 44 is a sectional view taken along a line XLIV-XLIV in FIG. 43.

Power conversion device 1 of the seventh exemplary embodiment is different from power conversion device 1 of the third exemplary embodiment in that pressing plate 170 extends not only on the high-heat generating component such as transformer circuit 3 and smoothing coil 20 mounted on second printed board module 50 but also other printed board modules such as first printed board module 40.

Pressing plate 170 is disposed between second printed board 51 and control circuit board 100b. Pressing plate 170 extends along second printed board 51 and extends along first printed board 41. Pressing plate 170 is disposed substantially horizontally with second printed board 51, is curved, and extends to at least first printed board 41 having the largest amount of heat generation. In other words, the structure of pressing plate 170 may have an at least L-shape, and be configured to cover the entire surface excluding one surface of control circuit board 100b (bath type) by extending to all the printed board modules. In order to fix extended pressing plate 170, the pressing plate 170 may be connected to the printed board opposite to the extended region by the fixing member. In addition, when a structure that hinders extension such as connection member 102 exists in the extended region of pressing plate 170, pressing plate 170 is hollowed out or bypassed so as not to physically interfere with the structure.

Pressing plate 170 is configured to press the electronic components of second printed board 51 and first printed board 41. Pressing plate 170 is opposite to at least second printed board 51 and also is opposite to first printed board 41. The portion of pressing plate 170 extended to first printed board 41 is substantially horizontal to first printed board 41 and substantially vertical to control circuit board 100b. Pressing plate 170 has thermal conductivity greater than or equal to 1.0 W/(m·K), preferably greater than or equal to 10.0 W/(m·K), and more preferably greater than or equal to 100.0 W/(m·K). Pressing plate 170 is formed of a metal material such as copper, iron, aluminum, an iron alloy, or an aluminum alloy. Pressing plate 170 may include a dissipation fin or the like in order to promote the heat dissipation to the surrounding atmosphere. In addition, pressing plate 170 is not necessarily integrally molded, but may be formed by combining a plurality of metal plates to connect the metal plates. An insulating member similar to first insulating member 42 and second insulating member 52 may be provided between pressing plate 170 and the high-heat generating component.

According to the seventh embodiment, in addition to the effect of the third embodiment, the heat dissipation of thermally connected electronic components can be further enhanced. In addition to the configuration of the third embodiment, pressing plate 170 acts as the shield against the noise emitted from first printed board module 40 by covering at least first printed board module 40, so that the amount of noise superimposed on control circuit board 100b can be prevented.

Further, the seventh embodiment may have a configuration in which pressing plate 170 extends not only on the high-heat generating components such as transformer circuit 3 and smoothing coil 20 mounted on fifth printed board module 80 opposite to second printed board module 50 but also other printed board modules such as first printed board module 40. In this case, pressing plate 170 is disposed between fifth printed board module 80 and control circuit board 100b. Pressing plate 170 is disposed substantially horizontally with fifth printed board module 80, is curved, and extends to at least first printed board 41 having the largest amount of heat generation. Pressing plate 170 is configured to press the electronic component of fifth printed board module 80. Pressing plate 170 is opposite to at least fifth printed board module 80, and is also opposite to first printed board 41.

In addition, the above-described embodiments can be appropriately combined.

It should be considered that the disclosed embodiments are an example in all respects and not restrictive. The scope of the present disclosure is defined by not the description above, but the claims, and it is intended that all modifications within the meaning and scope of the claims and their equivalents are included in the present invention.

REFERENCE SIGNS LIST

1: power conversion device, 30: casing, 40: first printed board module, 41: first printed board, 50: second printed board module, 51: second printed board, 60: third printed board module, 61: third connection member, 70: fourth printed board module, 71: fourth connection member, 80: fifth printed board module, 100*a*: control circuit module, 100*b*: control circuit board, 110: control element electronic component, 120: analog signal wiring group, 130: digital signal wiring group, 140: shield pattern, 141: extended shield pattern, 150: insulating layer, 160: fixing member, 170: holding plate, 180: sealing member

The invention claimed is:

1. A power conversion device comprising:
a casing to include at least two inner surfaces;
    a first printed board fixed to one of the at least two inner surfaces of the casing;
    a second printed board fixed to another of the at least two inner surfaces of the casing and disposed so as to intersect with the first printed board; and
    a control circuit board disposed along the second printed board,
    wherein the control circuit board includes circuit wiring and a shield pattern opposite to the circuit wiring in a layer different from the circuit wiring, and
    the shield pattern at least partially overlaps the circuit wiring when viewed from an opposite direction in which the shield pattern is opposite to the circuit wiring.

2. The power conversion device according to claim 1, wherein the shield pattern is extended from the circuit wiring when viewed from the opposite direction.

3. The power conversion device according to claim 2, wherein when viewed from the opposite direction, the shield pattern is extended by at least three times a thickness between the circuit wiring and the shield pattern in the opposite direction with respect to an outer end of the circuit wiring.

4. The power conversion device according to claim 1, wherein a potential of the shield pattern is identical to a potential of a ground of the control circuit board.

5. The power conversion device according to claim 4, wherein the potential of the ground of the control circuit board is identical to a potential of the casing.

6. The power conversion device according to claim 1, wherein
    the first printed board includes a first printed board circuit wiring having a potential identical to a potential of the shield pattern,
    the control circuit board includes an extended shield pattern, and
    the shield pattern is electrically connected to the first printed board circuit wiring and the extended shield pattern,
    the second printed board includes a second printed board circuit wiring having a potential identical to the potential of the shield pattern, and
    the shield pattern is electrically connected to the second printed board circuit wiring and the extended shield pattern.

7. The power conversion device according to claim 1, further comprising:
    an electronic component mounted on the second printed board; and
    a pressing plate disposed between the second printed board and the control circuit board, wherein the pressing plate is configured to press the electronic component against the second printed board.

8. The power conversion device according to claim 7, wherein the pressing plate extends along the second printed board and extends along the first printed board.

9. The power conversion device according to claim 1, further comprising an electronic component mounted on the second printed board,
    wherein the control circuit board is configured to press the electronic component against the second printed board.

10. The power conversion device according to claim 1, further comprising a sealing member filled in a space surrounded by the casing.

11. A power conversion device comprising:
    a casing to include a first inner surface and a second inner surface and being configured with the first inner surface and the second inner surface intersecting with each other;
    a first printed board fixed to the first inner surface of the casing;
    a second printed board fixed to the second inner surface; and
    a control circuit board disposed along the second printed board,
    wherein the control circuit board includes circuit wiring and a shield pattern opposite to the circuit wiring in a layer different from the circuit wiring, and
    the shield pattern at least partially overlaps the circuit wiring when viewed from an opposite direction in which the shield pattern is opposite to the circuit wiring.

12. A power conversion device comprising: a casing to include at least a first inner surface and a second inner surface; an
    electronic component to include a first component and a second component; a
    first printed board to include a first main surface on which the first component of the electronic component is mounted, and a second main surface opposite to the first main surface;
    a second printed board to include a third main surface on which the second component of the electronic component is mounted, and a fourth main surface opposite to the third main surface; and
    a control circuit board,
    wherein the second main surface of the first printed board is thermally connected to the first inner surface,
    the fourth main surface of the second printed board is thermally connected to the second inner surface,
    the second printed board extends in a direction from the second main surface toward the first main surface of the first printed board,
    the control circuit board is disposed along the second inner surface, and includes circuit wiring and a shield pattern opposite to the circuit wiring in a layer different from the circuit wiring, and
    the shield pattern at least partially overlaps the circuit wiring when viewed from an opposite direction in which the shield pattern is opposite to the circuit wiring.

13. The power conversion device according to claim 12, further comprising:
    an electronic component mounted on the second printed board; and
    a pressing plate disposed between the second printed board and the control circuit board, wherein the pressing plate is configured to press the
electronic component against the second printed board.

14. The power conversion device according to claim 12,
further comprising an electronic component mounted on the
second printed board, wherein the control circuit board is configured to press the
electronic component against the second printed board.

\* \* \* \* \*